(12) United States Patent
DiStefano et al.

(10) Patent No.: US 6,357,112 B1
(45) Date of Patent: Mar. 19, 2002

(54) METHOD OF MAKING CONNECTION COMPONENT

(75) Inventors: Thomas H. DiStefano, Monte Sereno; Joseph Fjelstad, Sunnyvale; Belgacem Haba, Cupertino; Owais Jamil, San Jose; Konstantine Karavakis, Pleasanton; David Light, Los Gatos; John W. Smith, Palo Alto, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/200,100

(22) Filed: Nov. 25, 1998

Related U.S. Application Data

(60) Provisional application No. 60/066,297, filed on Nov. 25, 1997.

(51) Int. Cl.[7] .................................................. H01R 9/06
(52) U.S. Cl. ........................... 29/843; 29/842; 228/4.5; 228/180.5; 228/199; 228/754
(58) Field of Search ......................... 29/825, 827, 829, 29/830, 840, 843, 842; 228/180.5, 799, 759, 757, 4.5

(56) References Cited

U.S. PATENT DOCUMENTS

| | | | |
|---|---|---|---|
| 3,842,189 A | 10/1974 | Southgate | ..................... 174/52 |
| 5,148,265 A | * 9/1992 | Khandros et al. | |
| 5,476,211 A | * 12/1995 | Khandros | |
| 5,518,964 A | * 5/1996 | DiStefano et al. | .......... 437/209 |
| 5,536,909 A | 7/1996 | DeStefano et al. | .......... 174/261 |
| 5,590,460 A | 1/1997 | DeStefano et al. | ........... 29/830 |
| 5,685,885 A | * 11/1997 | Khandros et al. | |
| 5,763,941 A | 6/1998 | Fjelstad | ..................... 257/669 |
| 5,807,453 A | 9/1998 | Smith et al. | ................. 156/150 |
| 5,852,871 A | * 12/1998 | Khandros | |

* cited by examiner

*Primary Examiner*—Carl J. Arbes
(74) *Attorney, Agent, or Firm*—Lerner, David, Littenberg, Krumholz & Mentlik, LLP

(57) ABSTRACT

A connection component for use in making microelectronic element assemblies, has peelable leads that are formed on a dielectric support structure. One end of each lead is permanently connected to the support structure and the opposite end of the lead is releasably connected to the support structure. When the releasable end of the lead is bonded to a contact on a semiconductor chip, the releasable end of the lead can be peeled from the support structure such that the chip may be moved away from the support structure. A compliant layer may be disposed between the chip and the support structure. If a compliant material is injected between the chip and the support structure to form the compliant layer, the compliant material will lift the chip away from the support structure and facilitate the peeling of the leads from the support structure.

8 Claims, 18 Drawing Sheets

METHOD OF MAKING CONNECTION COMPONENT

CROSS REFERENCE TO RELATED APPLICATIONS

The present application claims benefit of U.S. Provisional Patent Application No. 60/066,297, filed on Nov. 25, 1997, the disclosure of which is hereby incorporated by reference herein.

BACKGROUND OF THE INVENTION

1. Field of the Invention

The present invention relates to the art of electronic packaging and more specifically to components useful in making electrical connections to microelectronic elements such as semiconductor chips, and to method of manufacturing such components.

2. Description of the Related Art

Certain techniques for making semiconductor chip assemblies and similar microelectronic assemblies employ releasably attached leads. One such process is disclosed in commonly assigned, U.S. Pat. No. 5,518,964, the disclosure of which is hereby incorporated by reference herein. In certain preferred embodiments described in the '964 patent, a first element such as a dielectric layer in a connection component is provided with a plurality of elongated, flexible leads extending along a surface of the first element. Each lead has a terminal end permanently attached to the first element and has a tip end offset from the terminal end. The tip ends of the leads may be releasably secured to the first element. A second element such as a semiconductor chip having contacts thereon is engaged with the first element or connection component, and the tip ends of the leads are bonded to contacts on the chip or second element. The elements are then moved away from one another so as to deform the leads and provide vertically extensive leads extending between the first and second elements, i.e., between the chip and the connection component. A compliant material may be introduced between the chip and the connection component.

The resulting structure allows the chip to move relative to the connection component without substantial stresses on the leads, and thus provides compensation for thermal expansion and contraction. The preferred structures can be readily tested and can be mounted on a support substrate such as a printed circuit panel or the like. In the preferred processes, many leads can be deformed simultaneously.

In certain embodiments disclosed in the '964 patent, the tip end of each lead is bonded to the surface of the first element by a small spot of a base metal such as copper interposed between the tip end and the surface. Typically, such a spot is formed by a process in which the leads are formed from an etch-resistant metal such as gold overlying a continuous layer of the base metal. The leads have wide portions at the tip and terminal ends. The component is then subjected to an etching process so as to undercut the lead and remove the base metal from beneath the etch-resistant metal at all locations except at the terminal end and at the tip end. At the tip end, the most, but not all of the base metal is removed from beneath the etch-resistant metal, leaving a very small spot of the base metal. The strength of the bond between the tip end and the connection component surface is effectively controlled by the size of the spot. Thus, although the base metal may provide a relatively high bond strength per unit area or per unit length, it may still provide a weak attachment at the tip end of the lead end of the first element surface.

As described in certain embodiments of U.S. Pat. No. 5,536,902, the disclosure of which is hereby also incorporated herein by reference, a connection component may incorporate a support structure such as a polyamide or other dielectric layer with one or more gaps extending through such layer. Preferably, the support structure incorporates one or more flexible or compliant layers. The connection component may further include leads extending across the gap. Each lead has a first or terminal end permanently secured to the support structure on one side of the gap, and a second end releasably attached to the support structure on the opposite side of the gap. In preferred processes as taught by the '902 patent, the connection component is positioned on a semiconductor chip or other microelectronic element. Each lead is engaged by a bonding tool and forced downwardly into the gap, thereby detaching the releasably connected second end from the support structure. The leads are flexed downwardly into the gap and bonded to the contacts on the chip or the microelectronic element. Preferred connection components and processes according to the '902 patent also provide highly efficient bonding processes and very compact assemblies. The finished products provide numerous advantages such as compensation for thermal expansion and contraction, ease of testing, and a compact configuration.

Other structures disclosed in the '902 patent and in the '964 patent employ a frangible lead section connecting the releasable end of each lead to another structure permanently mounted to the support structure or first element. Frangible sections can also provide useful results. However, such frangible elements are most commonly constructed by forming narrow sections which are themselves formed using the same type of the photo-etching or selective deposition processes as are used to form the lead itself. The minimum width of the narrow section can be no less than the smallest width formable in the process. As the other portions of the lead adjacent to the narrow section must be wider than the narrow section, these other portions must be larger than the minimum attainable in the process. Stated another way, the leads made by such a process generally are wider than the minimum line width attainable in the formation process. This limits the number of leads which can be accommodated in a given area.

In other embodiments disclosed in the '902 patent, the first or permanently mounted terminal end of a lead may have a relatively large area, whereas the second or releasably mounted end of the lead overlying the support structure may have a relatively small area, so that such second end will break away from the support structure before the first end when the lead is forced downwardly by the bonding tool. This arrangement requires careful control of the dimensions of the ends to control the area of the bond between the lead end and the support structure and also requires a lead wider than the smallest element formable in the process.

As described in U.S. patent application Ser. No. 08/547, 170, now U.S. Pat. No. 5,763,941, the disclosures of which are also hereby incorporated herein by reference, a connection component may incorporate a dielectric support structure and a plurality of leads extending along a surface of the dielectric support layer. Each lead has a first region that is permanently connected to the dielectric layer, and a second region which is releasably connected to the dielectric layer such that the second region can be detached from the dielectric layer by moving the lead away from the dielectric layer. The first and second regions are preferably disposed at opposite ends of the lead. In preferred embodiments, the second region is attached to the dielectric layer through a release interface having a peel strength of less than about 0.35×10$^6$ dynes/cm. In one embodiment in the '170 application, the release interface is formed by depositing a release metal onto the polymeric materials of the dielectric layer and abutting the metallic surface of the lead thereto. According to another aspect of the invention of the '170 application, the release interface can be formed in a deposition process in which the steps normally taken to assure good adhesion are omitted. Such steps include oxidation of, and high energy sputtering of nickel onto, the polymer layer. In yet another embodiment, the release interface incorporates a first release metal securely bonded to the dielectric layer and a second release metal on the lead, the first and second release metal being weakly bonded to one another.

In certain embodiments of commonly assigned U.S. patent application Ser. No. 08/634,784, which is incorporated herein by reference, Smith et al. disclose a connection component for a semiconductor assembly comprising a dielectric support layer having a gaps therein. The component also includes a plurality of strip-like leads that extend across the gaps and are bonded to a conductive material on the dielectric layer. The strip-like leads may be formed from lengths of wire and may be bonded to the conductive material using a bonding process such as thermosonic bonding.

Although these packages offer substantial improvements over the prior art in the packaging electronic devices, the force needed to peel the leads from the support structure may be excessive, especially for high lead count devices and for wafer level packaging.

Accordingly, further improvements in releasable lead structures and method of making the same would be desirable.

SUMMARY OF THE INVENTION

The present invention provides microelectronic element assemblies and connection components for microelectronic element assemblies. The connection components of the present invention have peelable leads. The peelable leads are formed on a support structure that includes a dielectric body. One end of each lead is permanently connected to the support structure and the opposite end of the lead is releasably connected to the support structure. When the releasable end of the lead is bonded to a contact on a semiconductor chip, the releasable end of the lead can be peeled from the support structure such that the chip may be moved away from the support structure to the extent that a compliant layer can be disposed between the chip and the support structure. If a compliant material is injected between the chip and the support structure to form the compliant layer, the compliant material will lift the chip away from the support structure and facilitate the peeling of the leads from the support structure.

DETAILED DESCRIPTION OF THE PREFERRED EMBODIMENTS

1. Selective Deposition or Removal of the Tie Coat

Figure 1:
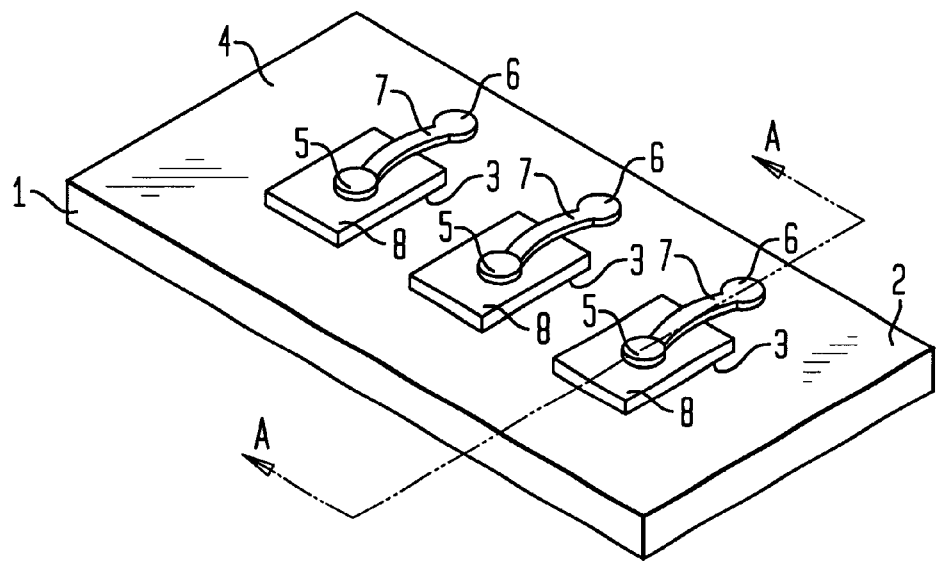
FIG. 1 is a diagrammatic perspective view of one embodiment of the present invention.

As depicted in FIG. 1, a connection component for a microelectronic element assembly in accordance with one embodiment of the present invention includes a support structure having a dielectric layer 1, a plurality of first regions 3 and a second region 4. Dielectric layer 1 has a top surface 2 that is defined by the plurality of first regions 3 and the second region 4. The support structure, may, as it is in FIG. 1, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers.

Figure 2:
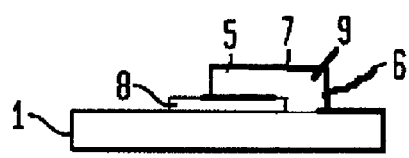
FIG. 2 is a side view of the connection component of this aspect of the present invention as seen along plane A—A.

FIG. 2 depicts the connection component of FIG. 1 in cross section as viewed along a vertical plane along line A—A. The connection component of this aspect of the invention also includes a plurality of adhesion promoter regions 8. Each of the adhesion promoter regions 8 is associated with one of the plurality of first regions 3 and is disposed over the associated first region. Each adhesion promoter region 8 is comprised of an adhesion promoter.

The connection component also includes a plurality of leads 7 disposed on the top surface 2 of the dielectric support structure 1. Each of the leads 7 has a terminal end 5 which is associated with one of the plurality of adhesion promoter regions 8 and is permanently connected to the associated adhesion promoter region 8. Each of the leads 7 also has a tip end 6 which is releasably attached to the second region 4 and offset from the terminal end 5.

The connection component of this aspect of the present invention further includes a plurality of release interfaces 9. Each of the release interfaces 9 is associated with a tip end 6 and is located between the associated tip end 6 and the second region 4 of the dielectric support structure 1. Each release interface 9 is free of the adhesion promoter.

Figure 3:
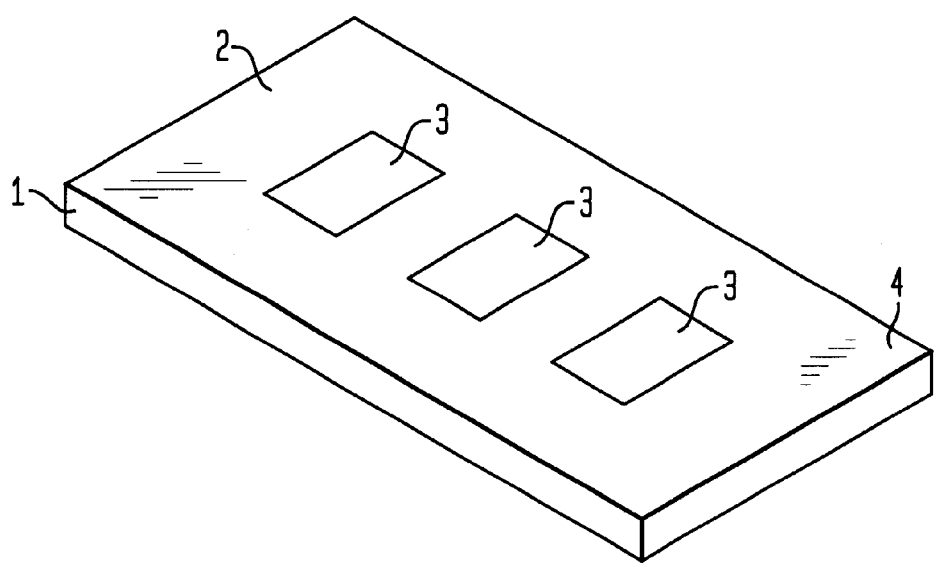
FIGS. 3–5 are diagrammatic perspective views of the connection component of this aspect of the invention in progressive stages of production.
Figure 4:
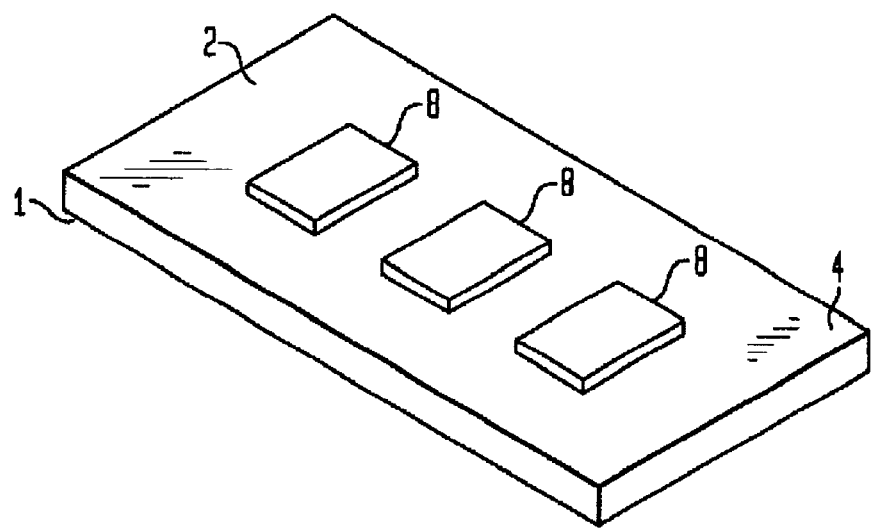
Figure 5:
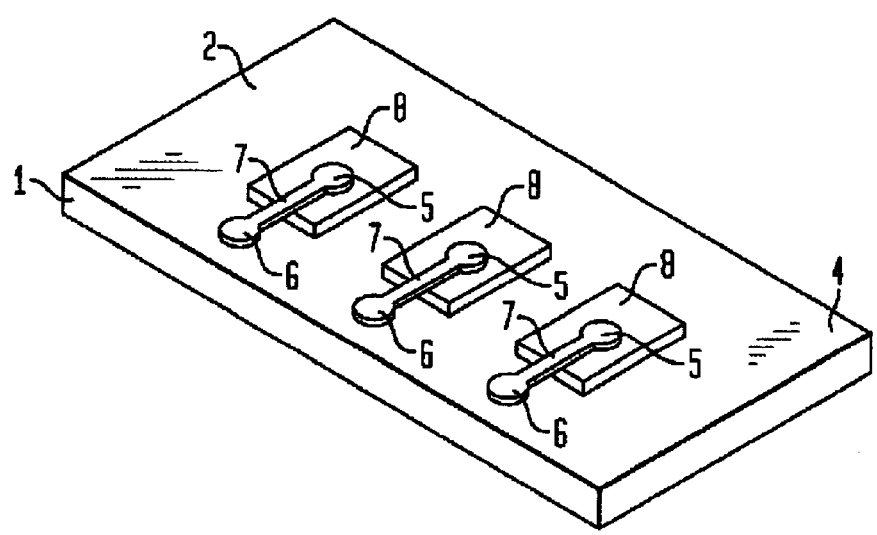

The connection component of this aspect of the present invention is depicted in various stages of production in FIGS. 3–5. As depicted in FIG. 3, a dielectric support structure 1 has a plurality of first regions 3 and a second region 4 that together define a top surface 2. An adhesion promoter is deposited over each first region 3 to form a plurality of adhesion promoter regions 8, as is depicted in FIG. 4. As depicted in FIG. 5, a plurality of leads 7 are formed on top surface 2 of dielectric support structure 1. Each lead 7 has a terminal end 5 and an tip end 6. Each terminal end 5 is permanently bonded to one of the adhesion promoter regions 8. Each tip end 6 is releasably attached to the second region 4.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The adhesion promoter layer is typically comprised of a metallic material or an organic adhesive. Metallic materials are preferred. When the adhesion promoter layer is a metallic material, the metallic material is typically deposited using sputter deposition, vapor deposition, or chemical evaporation. When the adhesion promoter layer is comprised of a metallic material it is sometimes referred to as a "tie coat". Preferred tie coats include nickel, nickel alloys, chrome and chrome alloys. Monel is a preferred nickel alloy. The thickness of the tie coat is typically from 50 Å to 5000 Å, preferably from 200 Å to 500 Å. Preferred organic adhesion promoters include acrylic adhesives, polyimide adhesives, thermoplastic adhesives, silane coupling agents, and fluorinated silane coupling agents.

The leads are typically made from an electrically conductive material. Preferred conductive materials include copper, gold, silver, palladium, nickel, aluminum or combinations or alloys thereof. The preferred lead has a thickness of 15–25 microns. The lead may be comprised of a single layer of metal or may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the second region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The adhesion promoter layer and the leads are disposed on the first surface. The second surface preferably contains one or more layers selected from the group consisting of additional adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

The connection component of the present aspect of the invention may be prepared by selective deposition of the adhesion promoter or tie coat or by selective removal of the adhesion promoter or tie coat.

2. Selective Deposition of the Tie Coat

Figure 6:
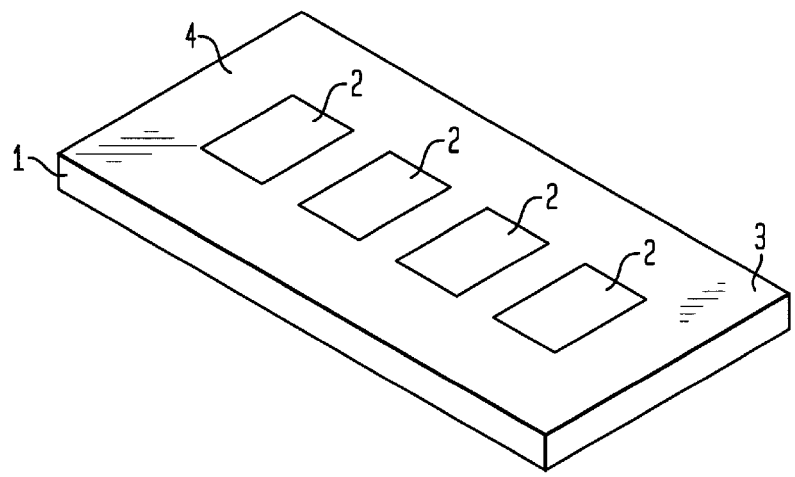
FIGS. 6–8 are diagrammatic perspective views of the connection component of another aspect of the invention in progressive stages of production.
Figure 8:
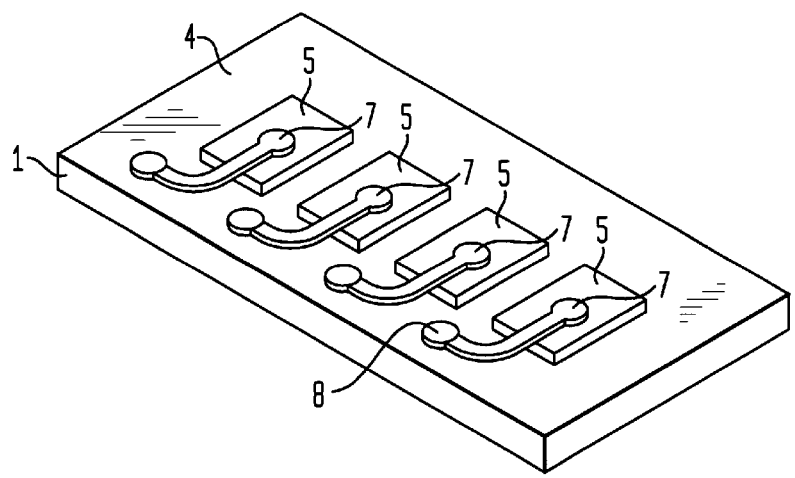
Figure 7:
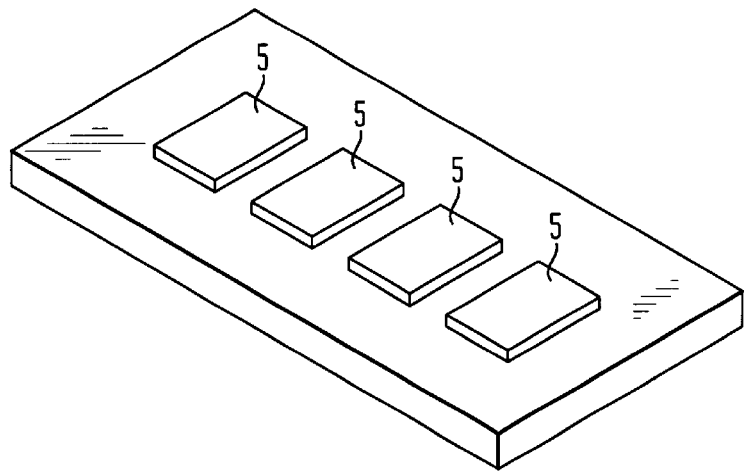

A process for preparing the connection component of this aspect of the invention by selectively depositing an adhesion promoter or tie coat is depicted in FIGS. 6–8.

The component of this aspect of the invention is prepared by providing, as is depicted in FIG. 6, support structure 1. In the embodiment pictured in FIG. 6, support structure 1 is comprised solely of a dielectric layer and is referred to hereinafter as dielectric support structure 1. The support structure must include as least one dielectric layer. The support structure may be a multi-layered construction comprised of one or more layers selected from the group consisting of adhesion promoter layers, adhesion inhibiting layers, conductive layers, and additional dielectric layers.

Dielectric support structure 1 further comprises a plurality of first regions 2, a second region 3, and a top surface 4 which is defined by the plurality of first regions 2 and the second region 3.

As is depicted in FIG. 7, an adhesion promoter is selectively deposited over the plurality of first regions 2 to form a plurality of adhesion promoter regions 5 on the top surface 4 of the dielectric support structure 1. Typically, the adhesion promoter is selectively deposited using sputter deposition, vapor deposition or chemical evaporation. Generally, such deposition or evaporation methods are carried out using a mask to prevent the adhesion promoter from being deposited in the second region. If some adhesion promoter is inadvertently deposited on second region 3, that adhesion promoter should be removed prior to forming the leads.

A plurality of leads 6, as is depicted in FIG. 8, are disposed over the top surface 4 of the dielectric support structure 1. Each lead 6 has a terminal end 7 that is associated with one of the plurality of adhesion promoter regions 5 and is permanently connected to the associated adhesion promoter region 5. Each lead 6 also has a tip end 8 which is releasably connected to the second region 3 and offset from the terminal end 7.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The adhesion promoter layer is typically comprised of a metallic material or an organic adhesive. Metallic materials are preferred. When the adhesion promoter layer is comprised of a metallic material it is sometimes referred to as a "tie coat". Preferred tie coats include nickel, nickel alloys, chrome and chrome alloys. Monel is a preferred nickel alloy. The thickness of the tie coat is typically from 50 Å to 5000 Å, preferably from 200 Å to 500 Å. Preferred organic adhesion promoters include acrylic adhesives, polyimide adhesives, thermoplastic adhesives, silane coupling agents, and fluorinated silane coupling agents.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the second region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The adhesion promoter layer and the leads are disposed on the first surface. The second surface preferably contains one or more layers selected from the group consisting of additional adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

3. Selective Removal of the Tie Coat

A process for preparing the connection component of this aspect of the invention by selectively removing the adhesion promoter or tie coat is depicted in FIGS. 9 through 13.

Figure 9:
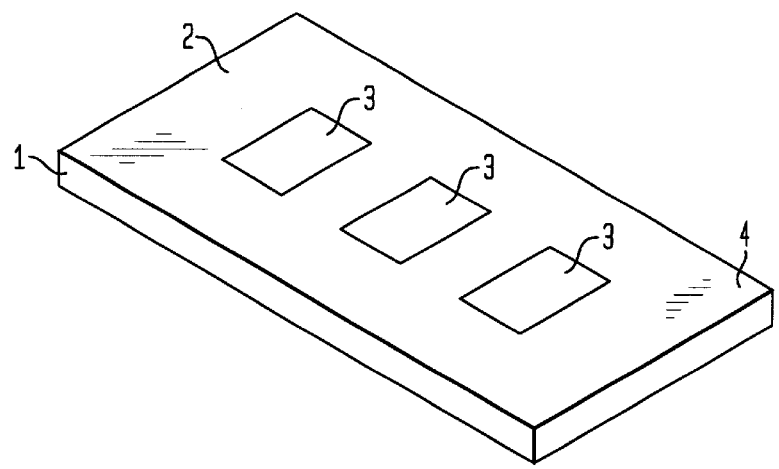
FIGS. 9–12 are diagrammatic perspective views of the connection component of another aspect of the invention in progressive stages of production.

First, as depicted in FIG. 9, a support structure, including a dielectric layer 1, is provided. In the embodiment pictured in FIG. 9, support structure 1 is comprised solely of dielectric layer 1, and is referred to hereinafter as dielectric support structure 1. The support structure must include as least one dielectric layer. The support structure may be a multi-layered construction comprised of one or more layers selected from the group consisting of adhesion promoter layers, adhesion inhibiting layers, conductive layers, and additional dielectric layers.

Figure 10:
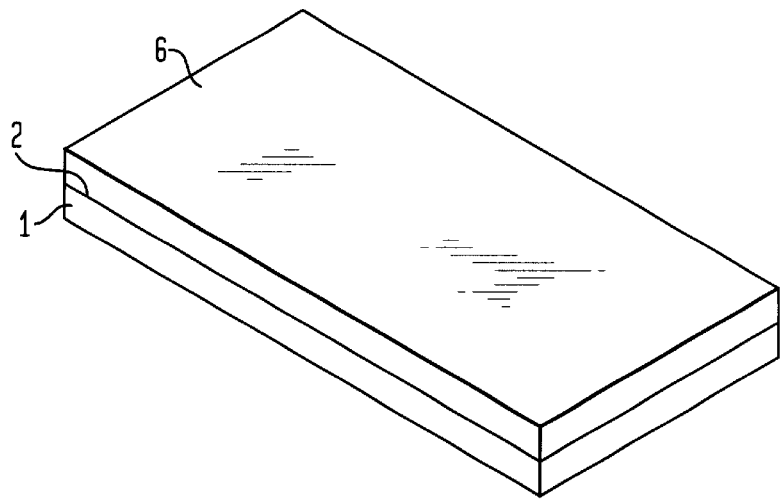
Figure 11:
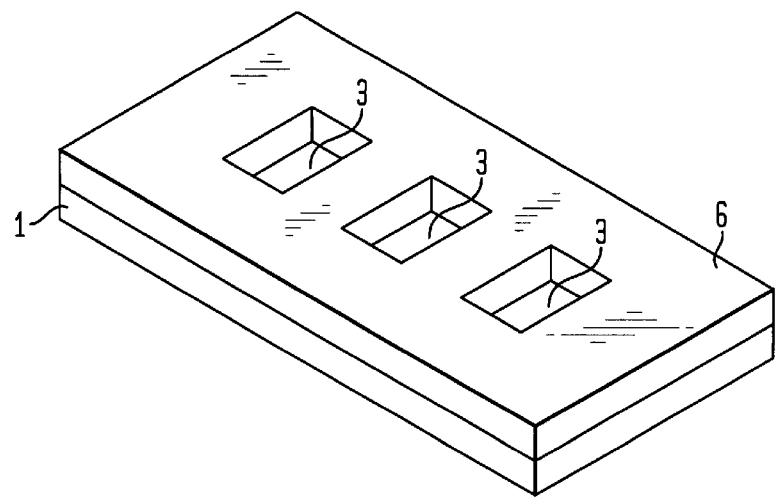
Figure 12:
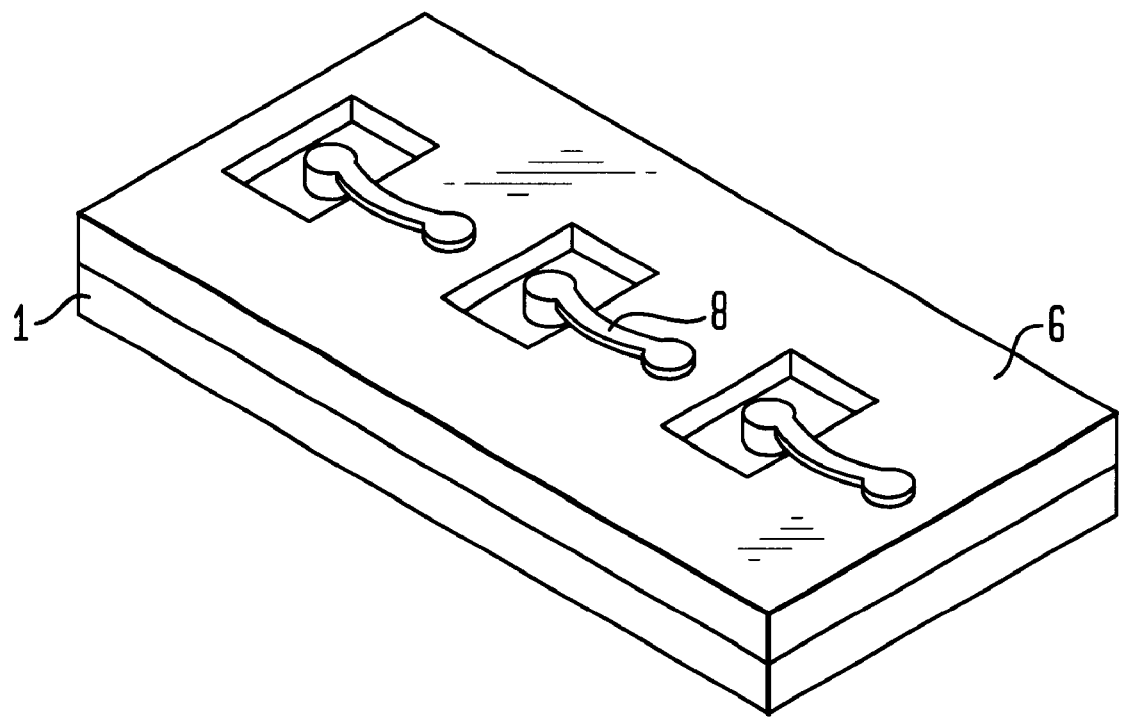
Figure 13:
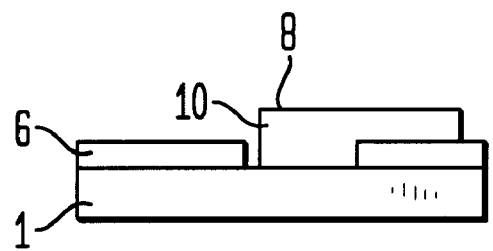
FIG. 13 is a side view of the connection component of this aspect of the invention.
Figure 14:
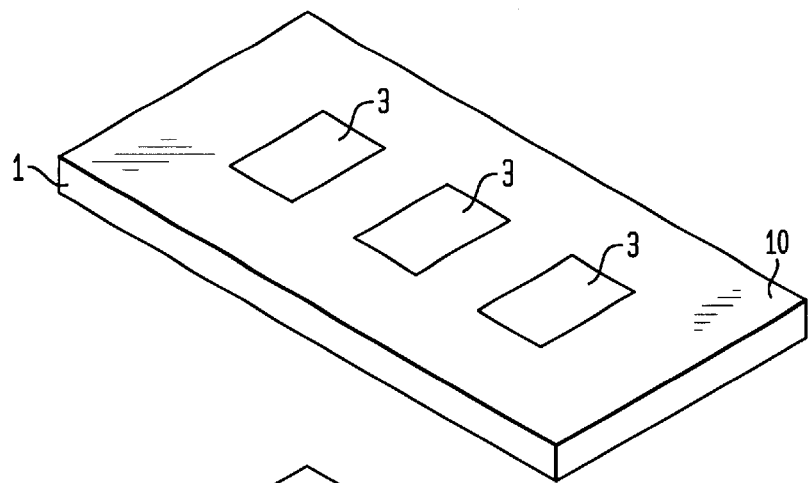
FIGS. 14–19 are diagrammatic perspective views of the connection component of another aspect of the invention in progressive stages of production.

Dielectric support structure 1 has a plurality of first regions 3 and a second region 4, which together define a top surface 2 of the dielectric support structure 1. As depicted in FIG. 10, an adhesion promoter is deposited over second region 4 to form adhesion promoter layer 6. Next, as depicted in FIG. 11, the adhesion promoter is selectively removed from each of the plurality of first regions 3. Then, as depicted in FIG. 12, a plurality of leads 8 are formed on top surface 2 of structure 1. A cross sectional view of the connection component of this aspect of the invention is depicted in 13. Each lead 8 has a terminal end 9 which is permanently connected to the adhesion promoter layer 6; and a tip end 10 which is associated with one of said plurality of first regions 3, releasably connected to the associated first region, and offset from terminal end 9.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The adhesion promoter layer is typically comprised of a metallic material or an organic adhesive. Metallic materials are preferred. When the adhesion promoter layer is a metallic material, the metallic material is typically deposited using sputter deposition, vapor deposition, or chemical evaporation. When the adhesion promoter layer is comprised of a metallic material it is sometimes referred to as a "tie coat". Preferred tie coats include nickel, nickel alloys, chrome and chrome alloys. Monel is a preferred nickel alloy. The thickness of the tie coat is typically from 50 Å to 5000 Å, preferably from 200 Å to 500 Å. Preferred organic adhesion promoters include acrylic adhesives, polyimide adhesives, thermoplastic adhesives, silane coupling agents, and fluorinated silane coupling agents.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated first region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The adhesion promoter layer and the leads are disposed on the first surface. The second surface preferably contains one or more layers selected from the group consisting of additional adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

4. Selective Removal of the Tie Coat and the First Metal Layer

Another aspect of the present invention provides a connection component prepared by selectively removing both an adhesion promoter layer and a conductive layer. This aspect of the invention is more fully described by reference to FIGS. 14 to 19.

The connection component of this aspect of the invention a support structure having a dielectric layer, an adhesion promoter layer that is disposed on the dielectric layer, and a first conductive layer disposed on the adhesion promoter layer. The connection component of this aspect of the present invention can be prepared by selective removal of both the adhesion promoter layer and the conductive layer, prior to forming the plurality of leads.

The connection component of this aspect of the invention includes a support structure having a dielectric layer 1. The support structure may, as it is in FIG. 14, be comprised solely of a dielectric layer, or it may be a multi-part structure. When the support layer is comprised solely of a dielectric layer, it will be referred to herein as a dielectric support structure 1. The support structure must include at least one dielectric layer and may include one or more layers selected from the group consisting of adhesion promoter layers, adhesion inhibiting layers, conductive layers and additional dielectric layers. Dielectric support structure 1 is comprised of a plurality of first regions 3 and a second region 10.

Figure 15:
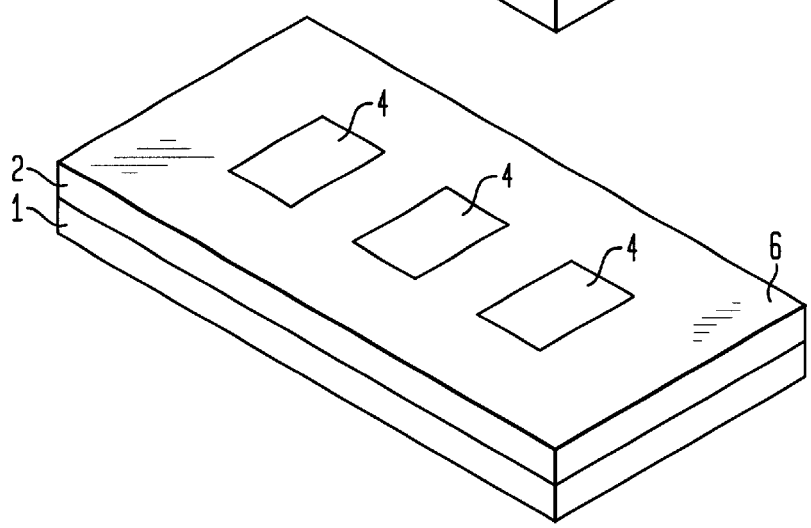

As is depicted in FIG. 15, an adhesion promoter is disposed over the dielectric support structure 1 to form an adhesion promoter layer 2. Adhesion promoter layer 2 is typically from about 50 Å to about 5000 Å thick, and is preferably a metallic material. Nickel, nickel alloys, chrome or chrome alloys are preferred metallic materials. Monel is a preferred nickel alloy. Adhesion promoter layer 2 is defined by a plurality of first areas 4 and a second area 6. Each of the plurality of first areas 4 is associated with one of the plurality of first regions 3 and disposed over the associated first region 3. The second area 6 is disposed over the second region 10.

Figure 16:
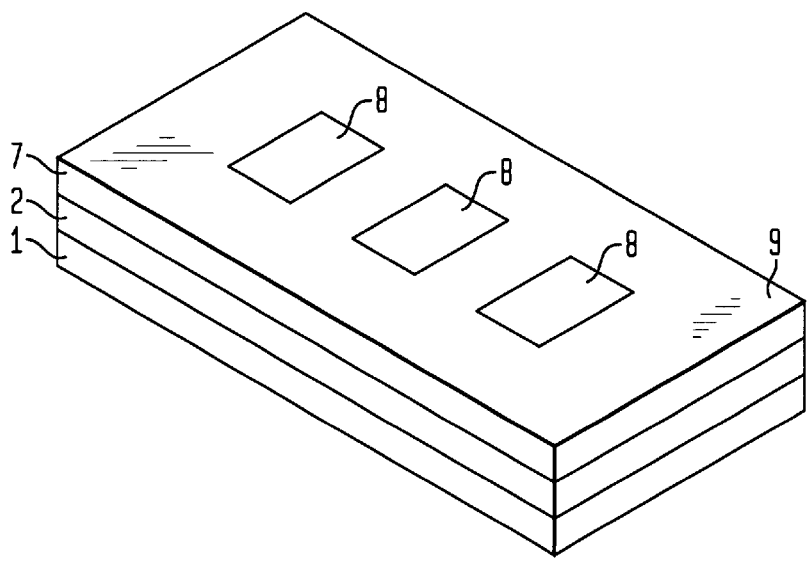

As is depicted in FIG. 16. Conductive layer 7 is disposed over adhesion promoter layer 2. The conductive layer is typically about 5 microns to about 25 microns thick, and is preferably made from copper. The conductive layer is typically prepared by plating or sputtering copper over the adhesion promoter layer. Conductive layer 7 is defined by a plurality of first sections 8 and a second section 9. Each first section 8 is associated with one of first areas 4 and is disposed over such associated first area 4. The second section 9 is disposed over the second area 6. The conductive layer is comprised of a first conductive material.

Figure 17:
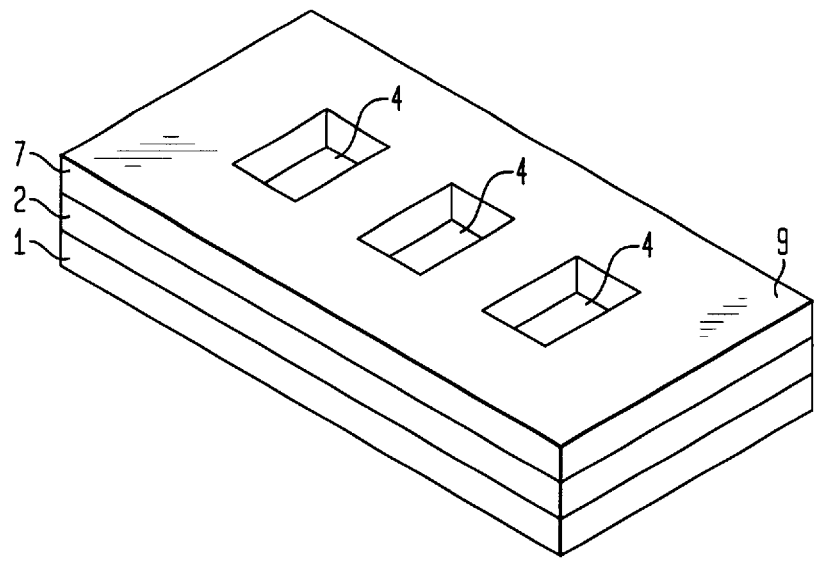
Figure 18:
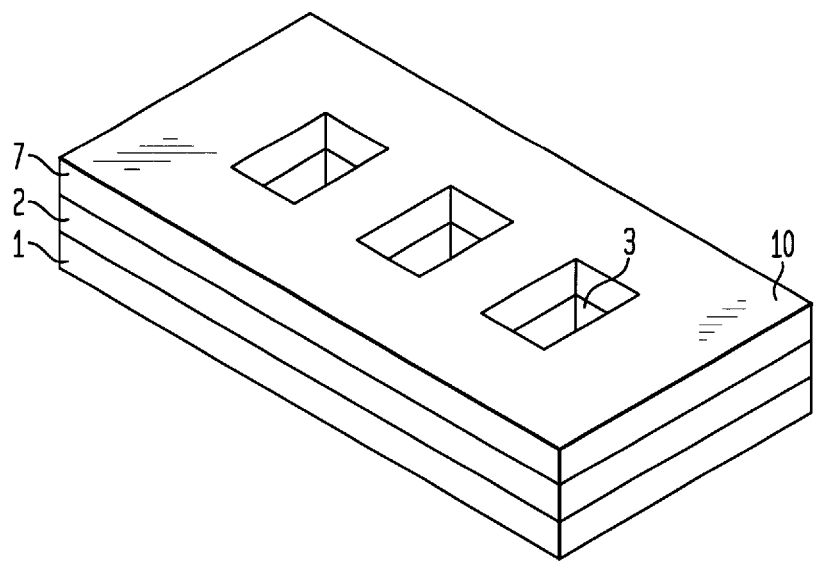

The first conductive material should be removed from each of the first sections 8, as is depicted in FIG. 17. The adhesion promoter should be removed from each of the first areas 4, as is depicted in FIG. 18. The adhesion promoter and the first conductive material can be removed in selected areas by using, for example, photolithographic techniques.

Figure 19:
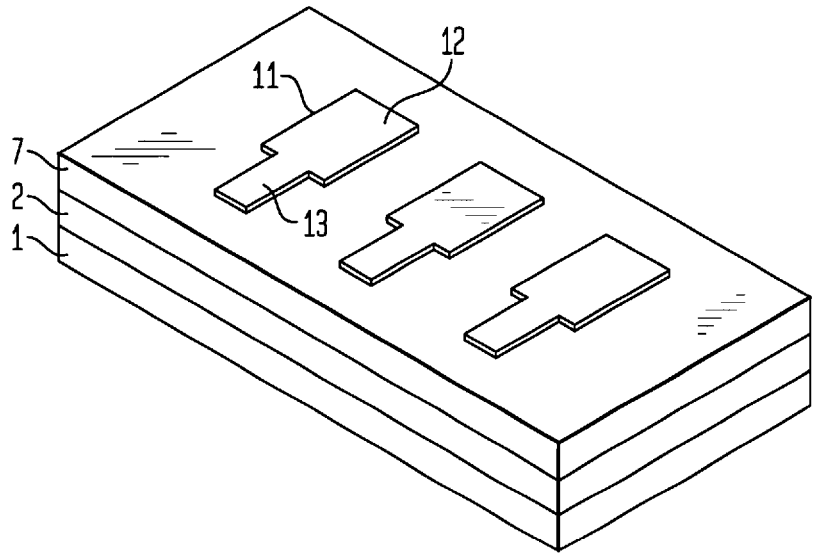

As is depicted in FIG. 19, a plurality of leads 11 are formed. Each lead 11 has a terminal end 13 which is permanently connected to the second section 9; and a tip end 12 which is associated with one of the first regions 3, releasably connected to such associated first region 3, and offset from the terminal end 13.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated first region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The adhesion promoter layer, the conductive layer and the leads are disposed on the first surface. The second surface preferably contains one or more layers selected from the group consisting of additional adhesion promoter layers, adhesion inhibiting layers, additional conductive layers and additional dielectric layers. The layers on second surface may define a ground plane and/or other circuit features, such as leads, terminals, solder pads, etc. A plurality of solder balls may be disposed on the second surface.

5. Selective Heat Treatment of Leads to Locally Degrade Adhesion

Figure 20:
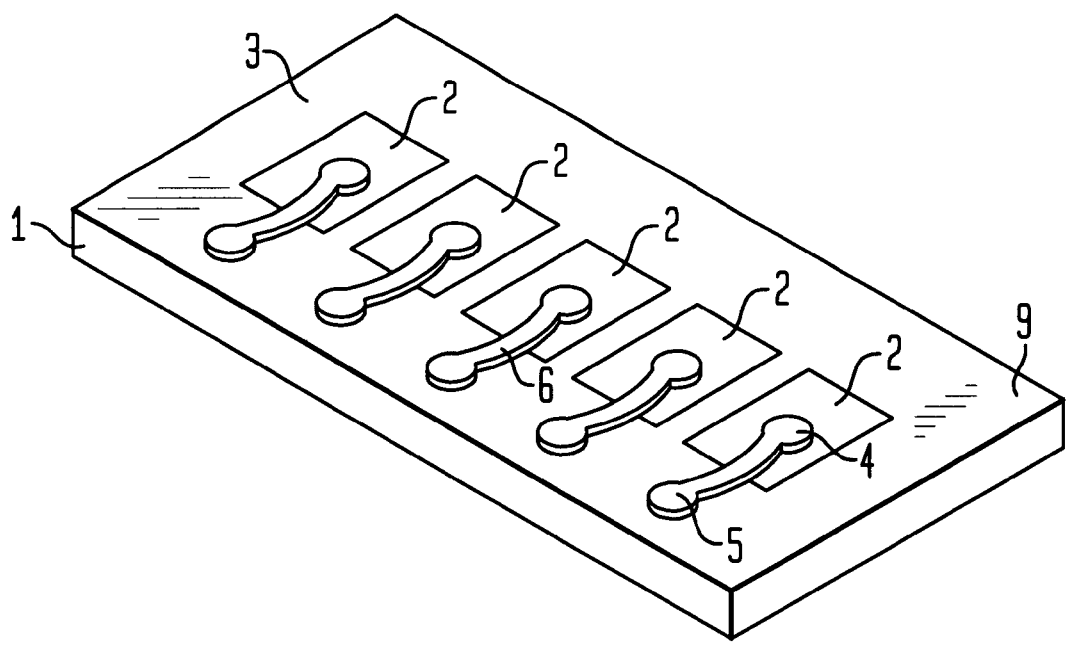
FIG. 20 is a diagrammatic perspective view of the connection component of another aspect of the invention.

Another aspect of the present invention provides a connection component for a microelectronic element assembly having peelable leads prepared by selectively heat treating a portion of each lead to locally degrade the adhesion between that portion of the lead and the support structure. The connection component of this aspect of the invention is depicted in FIG. 20, and includes a support structure comprised of a dielectric layer and referred to hereinafter as dielectric support structure 1. The support structure, may, as it is in FIG. 20, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. Dielectric support structure 1 includes a top surface 9, which is defined by a plurality of first regions 2 and a second region 3.

The connection component further includes a plurality of leads 6 disposed on the top surface 9 of the dielectric support structure 1. Each of the leads 6 have a terminal end 5 which is permanently connected to the second region 3; and a tip end 4 associated with one of the first regions 2, releasably attached to the associated first region 2, and offset from the terminal end 5.

Figure 21:
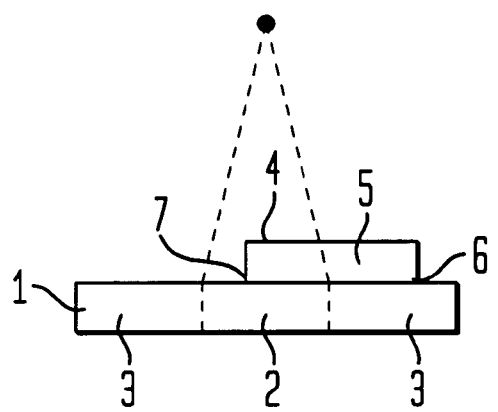
FIG. 21 is a side view of the connection component of this aspect of the invention.

The connection component further includes a plurality of release interfaces 7, one of which is depicted in FIG. 21. Each of the release interfaces 7 corresponds to one of the leads 6, is located between tip end 4 of corresponding lead 6 and the associated first region 2 of the dielectric support structure 1, and formed by heat treating the tip end 4 of the corresponding lead 6. In the alternative, each first region 2 could be subjected to a heat treatment to form each release interface 7. A heat treatment 8 is depicted in FIG. 21.

The heat treatment can be accomplished by any method capable of localized heating, for example, using a laser or by conductive heating. Generally, a laser selected for accomplishing the heat treatment step of this invention will be a YAG Laser, an excimer laser, or a $CO_2$ laser or other infrared laser. The heat treating step is preferably preformed as part of the process to connect a semiconductor chip or other microelectronic element to the connection component of this aspect of the invention. Most preferably the heat treating step is as part of the process to bond the leads to connection pads on the semiconductor chip or other microelectronic element.

6. Forming a Heat Susceptible Interface

In an alternative embodiment, the present invention provides a connection component having a heat susceptible interface between each tip end and each first region.

The connection component of this aspect of the invention includes a support structure comprised of a dielectric layer. The dielectric layer includes a plurality of first regions and a second region, which together define a top surface of the dielectric layer. The connection component further includes a plurality of leads disposed on the top surface of the dielectric layer. Each of the leads has a terminal end which is permanently connected to the second region; and a tip end which is associated with one of the plurality of first regions, disposed over the associated first region, and offset from the terminal end.

The connection component further includes a plurality of release, or heat susceptible, interfaces. Each of the heat susceptible interfaces is located between the tip end of the one of the plurality of leads and the associated first region. Each such interface is formed by depositing a heat susceptible material on each of the plurality of first regions. When the heat susceptible interface is exposed to a heat treatment, such as any of the heat treatments mentioned above, the heat susceptible interface becomes a releasable interface, and the tip end of the lead can be peeled away from the dielectric layer. The heat treatment may be a local heating of each tip end and/or each first region; or it may be a more global heating of all or most of the connection component. In a preferred embodiment, the heat treatment step is accomplished during the process in which the tip end of the lead is bonded to a contact on a microelectronic element by heating the tip end.

If the heat susceptible material is deposited over the plurality of first regions and the second region, the heat treatment step must be preformed locally.

The heat susceptible material may be a blowing agent or any material which will degrade upon exposure to heat to form a releasable interface between a tip end and a first region. Preferred heat susceptible materials are blowing agents which degrade to evolve nitrogen or carbon dioxide gas. Blowing agents which degrade upon exposure to a temperature from 200 to 400 C. are preferred, with blowing agents which degrade at a temperature from 200 to 250 C. being particularly preferred. The nitrogen or carbon dioxide gas then dissipates into the atmosphere. Blowing agents which evolve nitrogen gas are preferred and include such compounds include azo compounds, dinitroso compounds and hydrazine derivatives, such as, for example, azodicarbonamide, 4,4'-oxybis(benzene-sulfohydrazide), diphenylsulfone-3,3'-disulfohydrazide, diphenylene oxide-4,4'-disulfohydrazide, trihydrazinotriazine, p-toluenesulfonyl semicarbazide, toluene sulfonyl hydrazide, oxybis(benzene sulfonyl hydrazide), 5-phenyltetrazole, isotoic anhydride, benzene sulfonylhydrazide, and dinitrosopentamethylenetetramine.

The heat susceptible materials of the present aspect of the invention can be replaced with materials which are susceptible to other forms of energy other than heat, such as, for example ultraviolet light, or radiation. Such materials are frequently polymers that "unzip" or depolymerize upon exposure to specific forms of energy. Radiation susceptible materials include nitrocellulose, polyphthalaldehydes, poly (methyl methacrylate) and polysulfones. A preferred polysulfone is poly(butene-1-sulfone) (hereinafter "PBS"). PBS degrades when exposed to radiation and is highly sensitive to electron beams. Upon exposure to such radiation, the PBS degrades and forms sulfur dioxide and butene.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is disposed over the associated first region and the heat susceptible material, and will be peelable from the support structure. Preferably, the peelable Portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The heat susceptible material and the leads are disposed on the first surface. The second surface preferably contains one or more layers selected from the group consisting of adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

7. Selective Electrophoretic Disposition of Polymer

Figure 22:
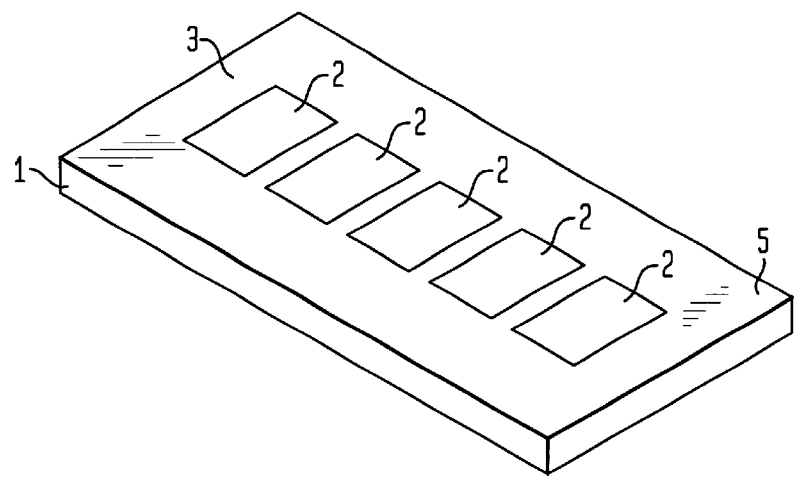
FIGS. 22–24 are diagrammatic perspective views of the connection component of another aspect of the invention in progressive stages of production.
Figure 24:
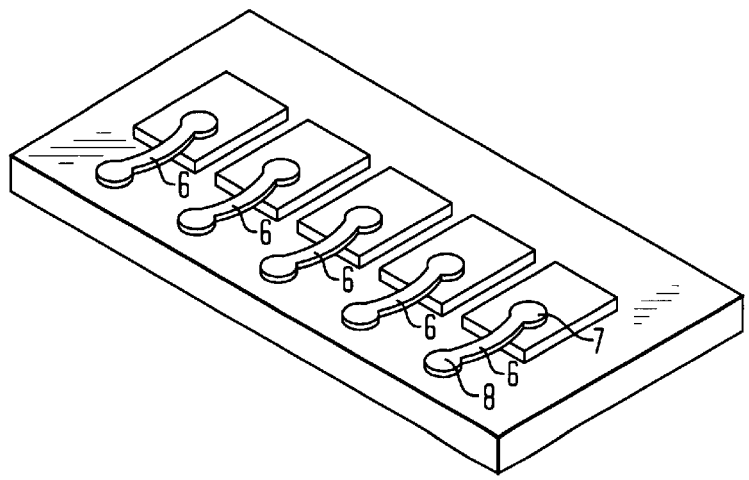

A connection component for a microelectronic element assembly according to another aspect of the invention is depicted in FIG. 24. The connection component of this aspect of the invention includes a support structure. The support structure, may, as it is in FIG. 22, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. Dielectric support structure 1 includes a top surface 5 defined by a plurality of first regions 2 and a second region 3.

Figure 23:
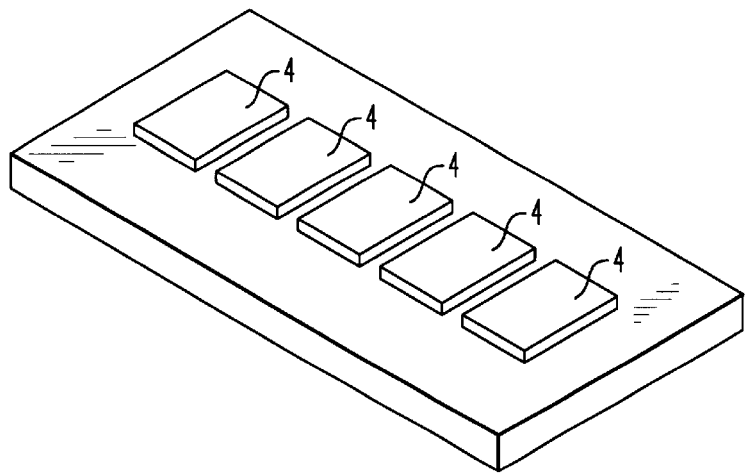

As depicted in FIG. 23, the connection component of this aspect of the invention also includes a plurality of polymer layers 4. Each polymer layer 4 is formed by depositing a polymer over the plurality of first regions 2. The second region should remain free of polymer. In preferred embodiments, each polymer layer 4 is formed by electophoretically depositing a polymer over each of the plurality of first regions 2.

As depicted in FIG. 24, the connection component of the present aspect of the invention further includes a plurality of leads 6 disposed on the top surface 5 of the dielectric support structure 1. The leads are generally formed either by electroplating or electroless deposition. In either case the area on which the leads will be disposed must be treated so that the lead can be formed. If the lead will be formed by electroplating, then the surface on which the lead will be deposited will need to be made conductive. This is typically done by seeding a metal layer or depositing a palladium colloid, a graphite colloid or a carbon dispersion. The lead can then be electroplated. If the lead will be formed by electroless deposition, then the surface on which the lead will be deposited will need to be made active. This is typically done with a palladium catalyst. The lead can then be formed by electroless deposition. Each of the leads 6 has a terminal end 8 which is permanently connected to the second region 3; and a tip end 7 which is associated with one of the polymer layers 4, releasably attached to the associated polymer layer 4, and offset from terminal end 8.

Generally each polymer layer 4 is comprised of a polymer having relatively poor adhesion to the lead material and relatively good adhesion to the dielectric layer. Alternatively, the polymer may be a material having a relatively weak cohesive strength such that the polymer fails cohesively when the tip end of the lead is pulled from the dielectric layer. The polymer of the polymer layer must be capable of being deposited in selected areas on the dielectric layer. The polymer may be deposited using for example, lithographic techniques or stenciling. The polymer may be, for example, a fluoropolymer or siloxane polymer. Preferred fluoropolymers include perfluoralkoxy and polytetrafluoroethylene. Siloxane polymers which are e-beam or otherwise imageable are preferred.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is disposed over the associated polymer layer, and will be peelable from the support structure. Preferably, the peelable portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The polymer layers and leads are disposed on the first surface. The second surface preferably contains one or more layers selected from the group consisting of adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

8. Selective Deposition and/or Development of Photoresist to Leave it Only in Areas to be Debonded A connection component according to another aspect of the present invention is prepared by depositing a photoresist material under a section of a lead and thereby making the lead peelable from its support structure. A process for preparing a connection component according to this aspect of the invention is depicted in FIGS. 25–30.

Figure 25:
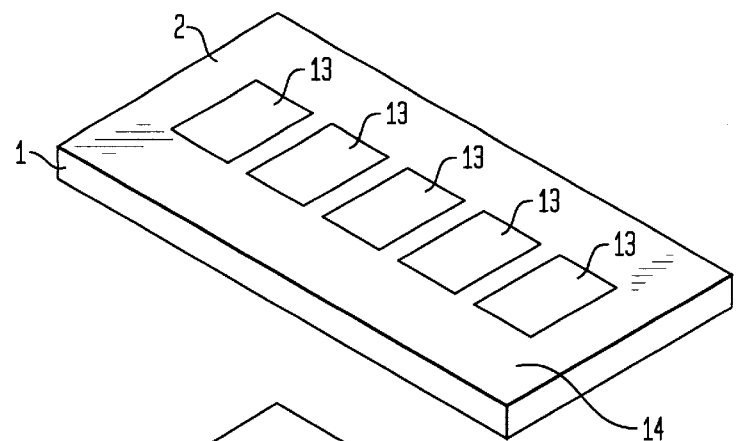
FIGS. 25–30 are diagrammatic perspective views of the connection component of another aspect of the invention in progressive stages of production.
Figure 26:
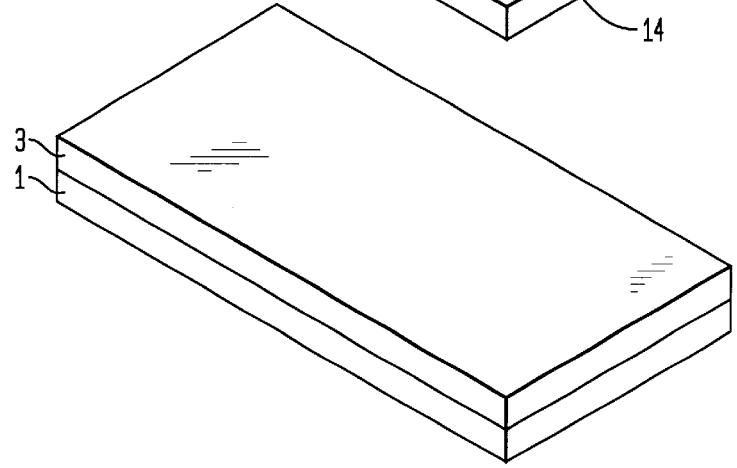
Figure 27:
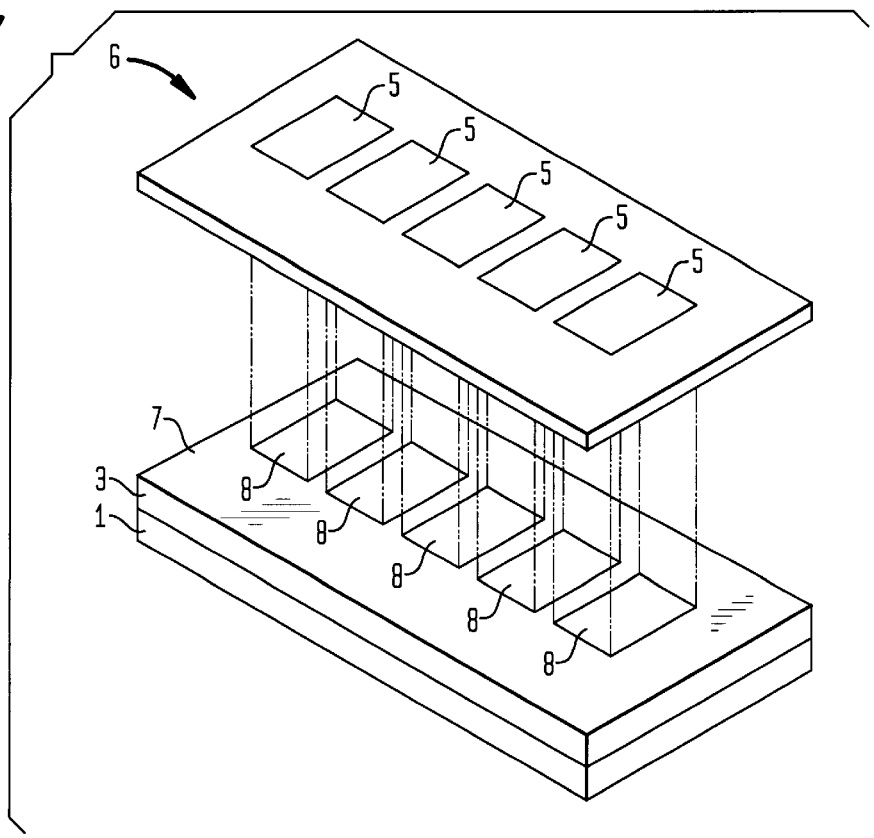

The connection component is prepared by providing, as depicted in FIG. 25, a support structure 1 having a dielectric layer. The support structure, may, as it is in FIG. 25, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. Structure 1 has a plurality of first regions 13 and a second region 14, which define a top surface 2. A photoresist material is then deposited over the top surface 2 to form photoresist layer 3, as depicted in FIG. 26. The photoresist material can be either positive-acting or negative-acting. The photoresist material may be sensitive to various types of energy, including an electron beam, ultraviolet light, infrared light and heat. Ultraviolet light sensitive photoresists are preferred. The photoresist layer 3 has a plurality of first sections 8 and a second section 7, as depicted in FIG. 27. Each of the plurality of first sections 8 corresponds to and overlies one of the plurality of first sections 13. The second section 7 corresponds to and overlies the second region 14.

If the photoresist material is a negative-acting, ultraviolet-light-sensitive material, a mask 4, having a plurality of ultraviolet light transmissive sections 5 is positioned over the photoresist layer 3. By the term "light transmissive" sections, we mean to include both light transparent sections and light translucent sections. By the term "ultraviolet light transmissive" sections, we mean to include both ultraviolet light transparent sections and ultraviolet light translucent sections. Each of the ultraviolet light transmissive sections 5 corresponds to one of the plurality of first sections 8 such that when the mask 4 is positioned above the photoresist layer 3 and the photoresist layer 3 is exposed to ultraviolet light 6 through the mask 4, the photoresist layer 3 is developed in the plurality of first sections 8 and remains undeveloped in the second section 7.

Figure 28:
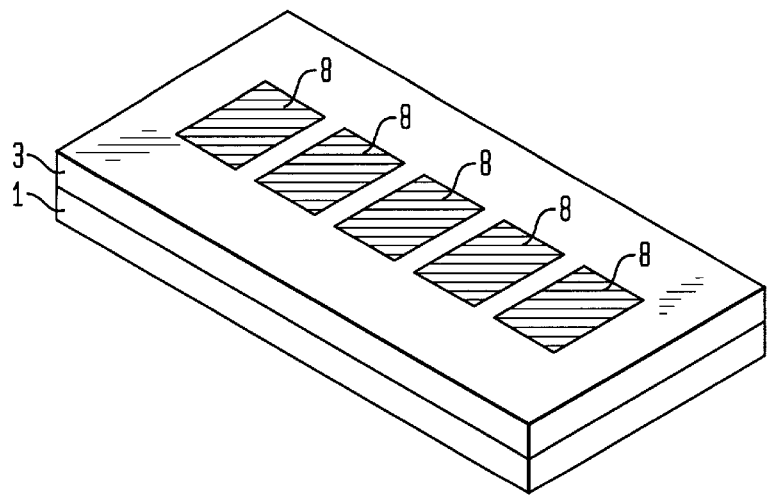
Figure 29:
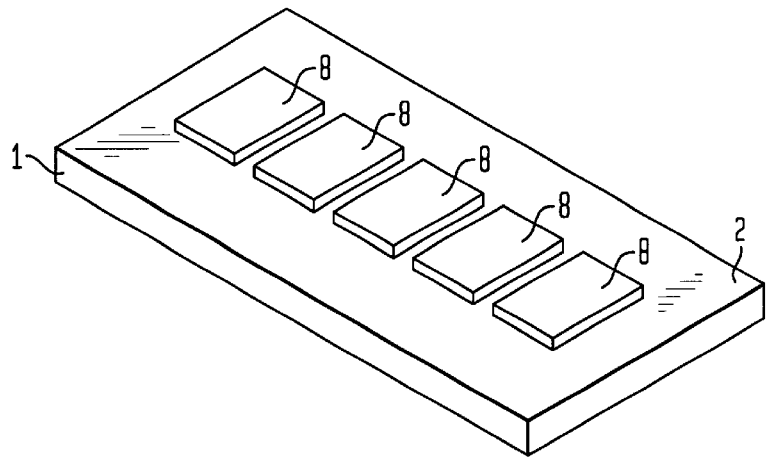

An ultraviolet light source (not shown) is position above the mask 4. The first sections 8 of photoresist layer 3 are exposed to ultraviolet light 6. The photoresist layer 3 is thereby developed in first sections 8 and remains undeveloped in second sections 7, as depicted in FIG. 28. The undeveloped photoresist layer in the second section 7 is then removed, as depicted in 29.

Figure 30:
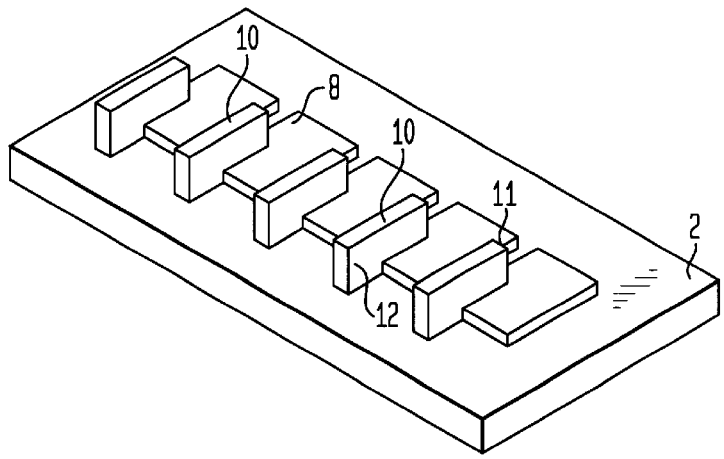

A plurality of leads 10, as depicted in FIG. 30, are formed on the top surface 2 of the dielectric support structure 1. Each of the leads 10 has a terminal end 12 which is permanently connected to the second region 14; and a tip end 11 associated with one of said plurality of first sections 8, connected to the associated first section 8, and offset from the terminal end 12.

The remaining photoresist layer in the plurality of first sections should be removed prior to bonding the leads to a microelectronic element. This is typically done using a chemical or plasma process to strip this photoresist and undercut the peelable portion of the lead.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated first region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The photoresist and the leads are disposed on the first surface. The second surface preferably contains one or more layers selected from the group consisting of adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

Figure 31:
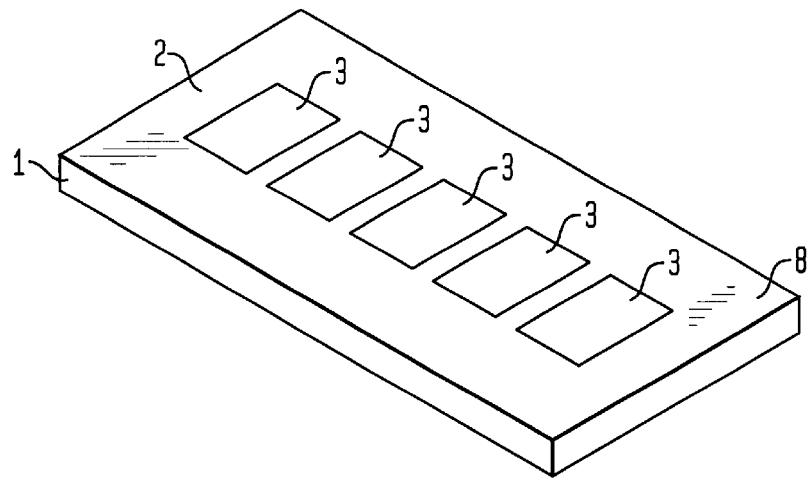
FIGS. 31–33 are diagrammatic perspective views of the connection component of another aspect of the invention in progressive stages of production.
Figure 32:
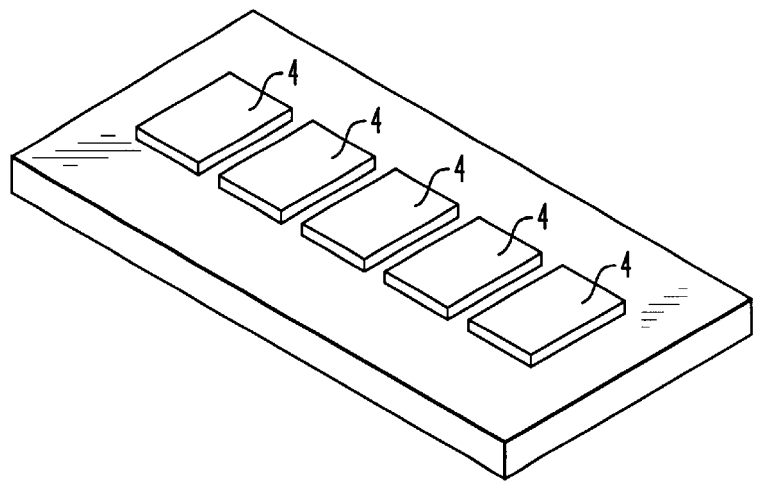
Figure 33:
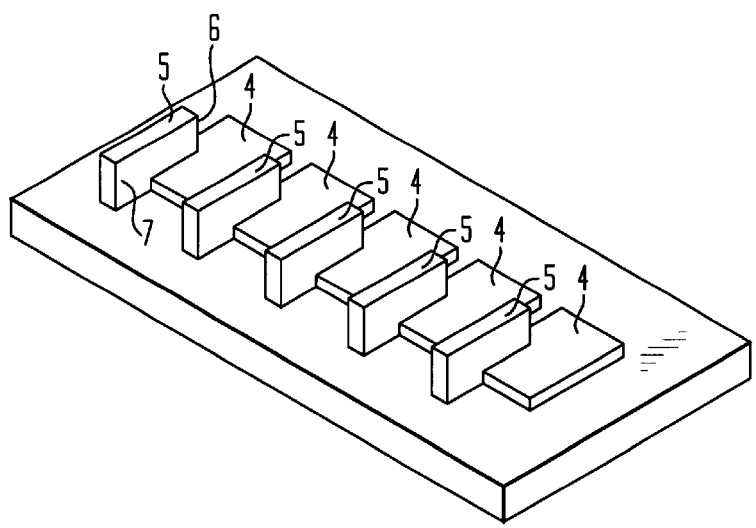

9. Selective Electrolytic Etching of Underlayer of Lead Using a Material which Etches More Readily at a More Negative Potential in Chosen Electrolyte than Lead Material A connection component according to another aspect of the present invention is prepared using an underlayer of a material on the leads that can be electrolytically etched more readily than the lead. The process for preparing such a connection component is depicted in FIGS. 31–33. The connection component according to this aspect of the invention is prepared by providing, as depicted in FIG. 31, a support structure having a dielectric layer. The support structure, may, as it is in FIG. 31, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. Dielectric support structure 1 has a plurality of first regions 3 and a second region 8 which together define a top surface 2.

As depicted in FIG. 32, a plurality of conductive layers 4 are deposited on the top surface 2. Each of the conductive layers 4 is associated with one of said plurality of first regions 3, disposed on the associated first region 3, and comprised of a first conductive material.

As depicted in FIG. 33, a plurality of leads 5 is formed on top surface 2. Each lead 5 has a terminal end 7 which is connected to the second region 8; and a tip end 6 which is offset from terminal end 7, associated with one of the conductive layers 4, connected to the associated conductive layer and comprised of a second conductive material. The first conductive material is more rapidly etched than the second conductive material. In a preferred embodiment, the first conductive material electrolytically etches more rapidly, at a given electrical potential, than the second conductive material. In another preferred embodiment, the first conductive material chemically etches more rapidly in a given etching solution, than the second conductive material. In preferred embodiments, the first conductive material is nickel or aluminum and the second conductive material is copper.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof, with copper and copper alloys being particularly preferred. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is disposed over the associated conductive layer 4, is comprised of the second conductive material, and is peelable from the support structure. Preferably, the peelable portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The conductive layers and the leads are disposed on the first surface. The second surface preferably contains one or more layers selected from the group consisting of adhesion promoter layers, adhesion inhibiting layers, additional conductive layers and additional dielectric layers. The layers on second surface may define a ground plane and/or other circuit features, such as leads, terminals, solder pads, etc. A plurality of solder balls may be disposed on the second surface.

Figure 34:
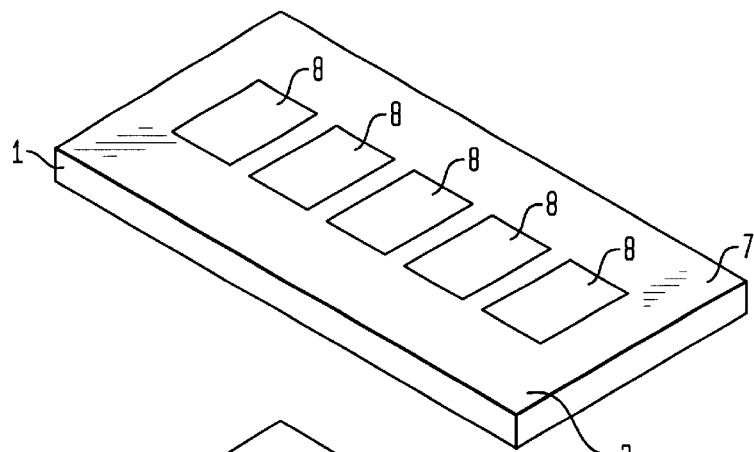
FIGS. 34–37 are diagrammatic perspective views of the connection component of another aspect of the invention in progressive stages of production.
Figure 35:
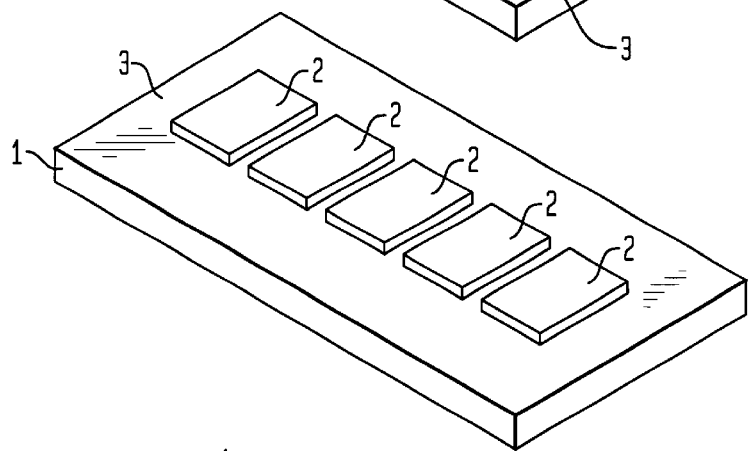
Figure 37:
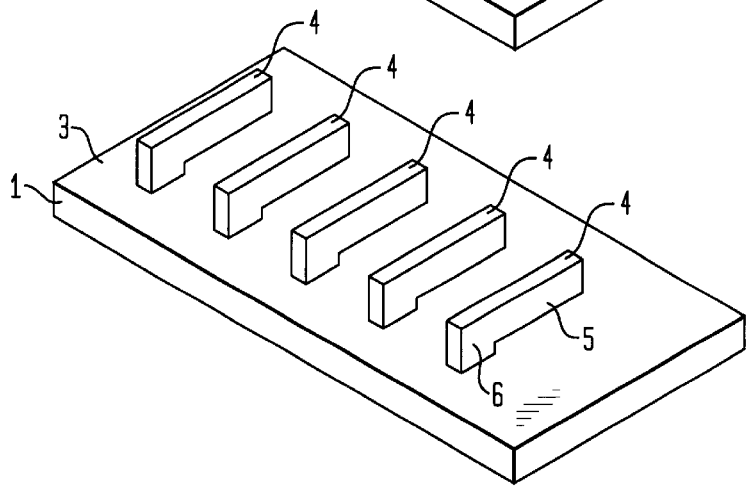
Figure 38:
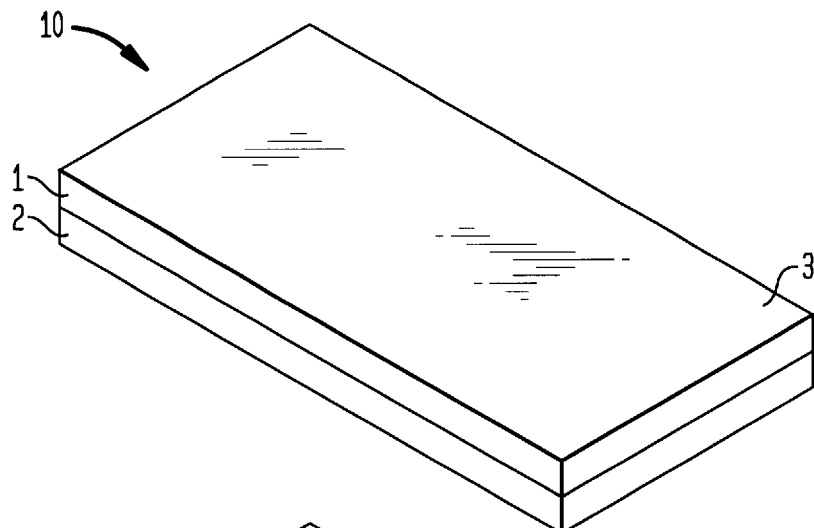
FIGS. 38–41 are diagrammatic perspective views of the connection component of another aspect of the invention in progressive stages of production.

10. Use of High Temp Bonding Process in Conjunction with Low Melting Point Metal Underlayer on Lead A connection component according to another aspect of the present invention is prepared using a underlayer of a material on the leads which has a melting point that is lower than the melting point of the lead. The connection component according to this aspect of the invention is depicted in FIG. 37. As depicted in FIG. 34, the connection component includes a support structure 1 having a dielectric layer. The support structure, may, as it is in FIG. 34, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. Dielectric support structure 1 has a plurality of first regions 8 and a second region 3 which together define a top surface 7. A plurality of conductive layers 2, as depicted in FIG. 35, are disposed over top surface 7 of the dielectric support structure 1. Each conductive layer 2 is associated with one of a plurality of first regions 8 on dielectric support structure 1 and disposed over the associated first region 8. Each conductive layer 2 is made of a first conductive material.

Figure 36:
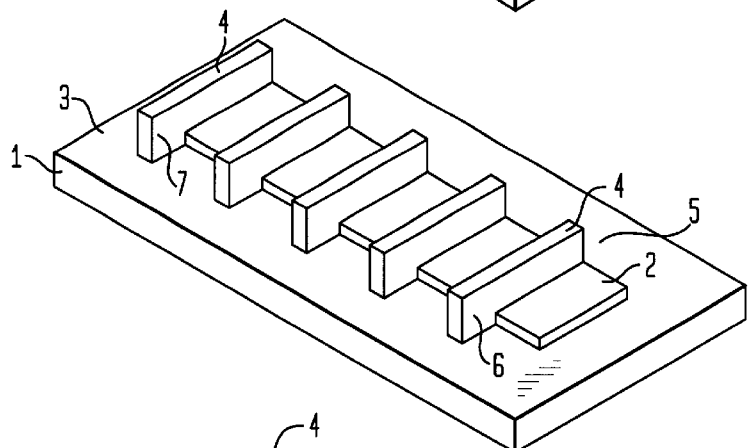

A plurality of leads, 4, as is depicted in FIG. 36, are formed on the top surface 7 of dielectric support layer 1. Each lead 7 has a terminal end 6 connected to the second region 3; and a tip end 5. Each tip end is associated with one of the conductive layers 2, connected to the associated conductive layer 2, and offset from terminal end 6. Each lead is comprised of a second conductive material. The second conductive material may be, for example, a single layer of a single conductive element, such as copper or gold, or may be a conductive combination or alloy of such conductive elements. The second conductive material may also be a multi-layer construction comprising one or more layers of conductive elements, combinations or alloys. The lead may also contain non-conductive layers which serve to reinforce the lead. The melting point of the second conductive material is higher than the melting point of the first conductive material.

In preferred embodiments the second conductive material is selected from the group consisting of copper, gold, and alloys and combinations thereof, with gold over copper being a particularly preferred combination. Preferred first conductive materials include tin, tin/lead alloys, indium, and indium alloys. Eutectic tin/lead alloys are particularly preferred. In a particularly preferred embodiment the first conductive material is an eutectic tin/lead alloy and the second conductive material is a gold/tin alloy over copper.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated conductive layer 2, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The conductive layers and the leads are disposed on the first surface. The second surface preferably contains one or more layers selected from the group consisting of adhesion promoter layers, adhesion inhibiting layers, additional conductive layers and additional dielectric layers. The layers on second surface may define a ground plane and/or other circuit features, such as leads, terminals, solder pads, etc. A plurality of solder balls may be disposed on the second surface.

Another aspect of the present invention provides a microelectronic element assembly. The assembly of this aspect of the present invention includes a microelectronic element and the connection component depicted in FIG. 37 and described immediately above. Microelectronic elements include single semiconductor chips, a plurality of individual semiconductor chips, a plurality of interconnected semiconductor chips or a wafer. The plurality of interconnected chips may be in the form of a multichip module. The microelectronic element has a plurality of contacts. The contacts on the microelectronic element are bonded the tip ends of the leads using a temperature that is high enough to melt the first conductive material but not high enough to melt the second conductive material.

11. Use of Aluminum Underlayer, Undercut Lead Using Low Conc. HCl

Figure 39:
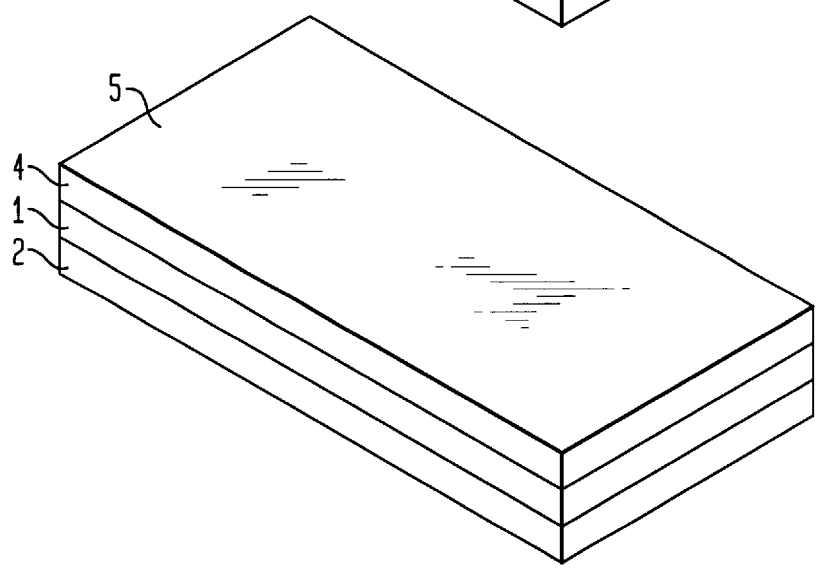

Another aspect of the present invention provides a connection component using an aluminum underlayer and copper or gold leads. The leads are undercut using a hydrochloric acid, which preferentially dissolves the aluminum. The connection component of this aspect of the present invention is more fully described with reference to FIGS. 38–43. The connection component of this aspect of the invention is prepared by providing a support structure, as depicted in 38, having a dielectric layer 1 and a conductive layer 2, wherein the dielectric layer 1 has a top surface 3 and is disposed on the conductive layer 2. Aluminum is deposited on top surface 3 to form aluminum layer 4, as depicted in FIG. 39. Aluminum layer 4 has a top side 5 and a bottom side (not shown) opposite the top side 5. The bottom side of aluminum layer 4 faces and is in contact with top surface 3.

Figure 40:
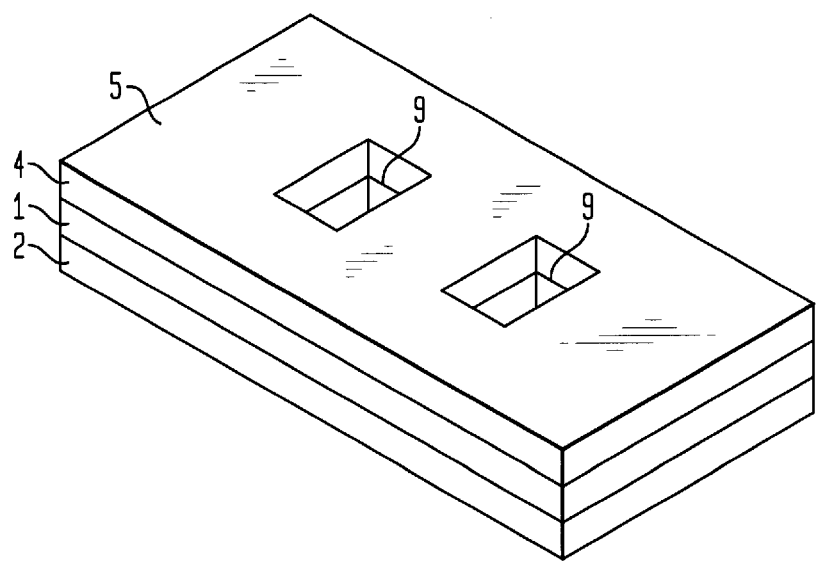

A plurality of holes are formed, as depicted in FIG. 40, in aluminum layer 4 and dielectric layer 1 such that portions of conductive layer 2 are exposed.

Figure 41:
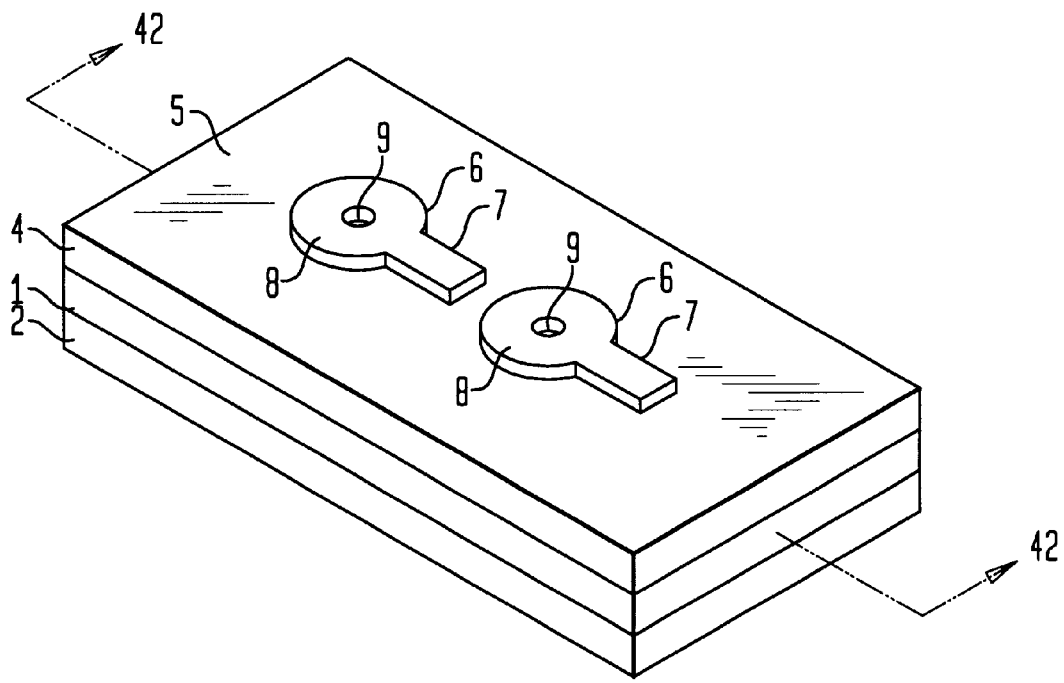
Figure 42:
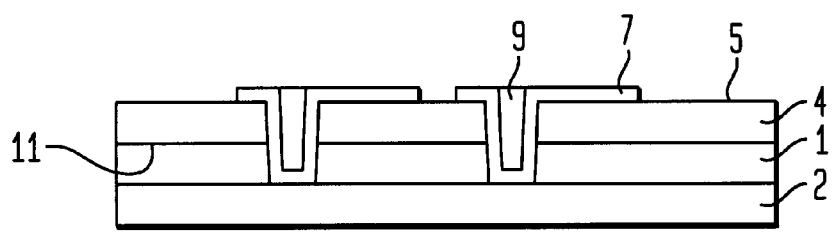
FIG. 42 is a side view of the connection component of this aspect of the invention, during one stage of the production of this component.

A plurality of leads 6 are formed over top side 5, as depicted in FIG. 41. Each lead 6 has a terminal end 8 disposed on top side 5 over one of the plurality of holes 9 and a tip end 7 disposed on the top side 5. A cross sectional view of the construction is depicted in FIG. 42, wherein dielectric support structure 1 is disposed over conductive layer 2 and aluminum layer 4 is disposed over dielectric support structure 1. A lead 6 is formed over hole 9 on top side 5 of aluminum layer 4.

Figure 43:
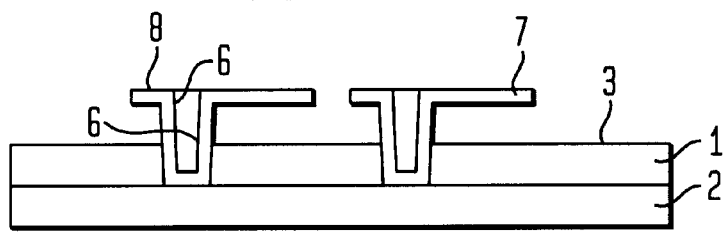
FIG. 43 is a side view of the connection component of this aspect of the invention, during another stage of the production of this component.

The aluminum layer 4 is then exposed to an acidic solution. A preferred acidic solution is a low concentration solution of hydrochloric acid. Although hydrochloric acid will etch other conductive materials that may used to form leads, such as copper, gold or combinations thereof, it etches aluminum more rapidly. The aluminum layer is etched away, as depicted in FIG. 43, leaving a lead 6 with a terminal end 6 permanently attached to the conductive layer 2 and a tip end 7 that is peelable.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated first region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a second surface opposite the first surface. The conductive layer, the aluminum layer and the leads are disposed on the first surface. The second surface preferably contains one or more layers selected from the group consisting of adhesion promoter layers, adhesion inhibiting layers, additional conductive layers and additional dielectric layers. The layers on second surface may define a ground plane and/or other circuit features, such as leads, terminals, solder pads, etc. A plurality of solder balls may be disposed on the second surface.

12. Use of Nickel-Based Tie Coat, Undercut Lead Using Nickel Stripping Solution

Figure 44:
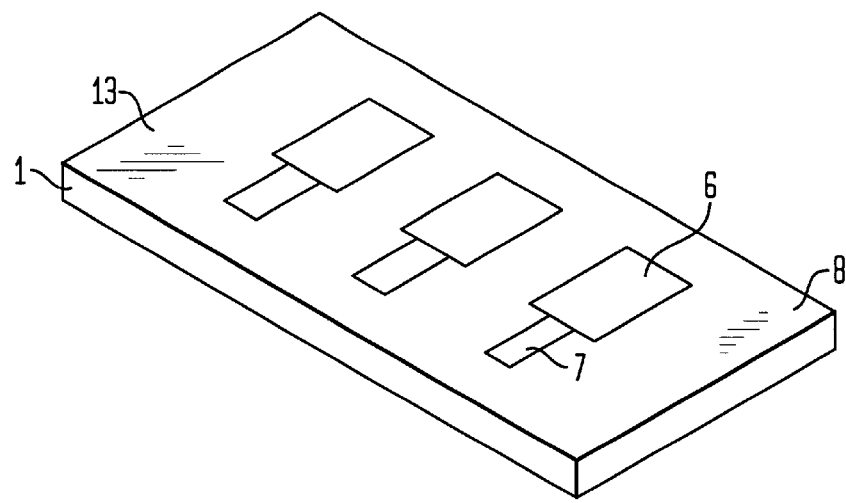
FIGS. 44–46 are diagrammatic perspective views of the connection component of another aspect of the invention in progressive stages of production.

Another aspect of the present invention provides a connection component that includes an adhesion promoter layer comprised of an adhesion promoter. The adhesion promoter layer is it is sometimes referred to as a "tie coat". The tie coat is nickel or a nickel alloy. A preferred nickel alloy is monel. The tie coat is typically deposited using sputter deposition, vapor deposition, or chemical evaporation. The thickness of the tie coat is typically from 50 Å to 5000 Å, preferably from 200 Å to 500 Å. The leads are comprised of a conductive material other than nickel. The component is exposed to a solution that rapidly etches the adhesion promoter but does not, or at most only minimally, attacks the conductive material of the leads. A method of preparing a connection component according to this aspect of the present invention is more fully explained by reference to FIGS. 44–47. The connection component of this aspect of the invention is prepared by providing a support structure having a dielectric layer. The support structure, may, as it is in FIG. 44, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers.

Figure 45:
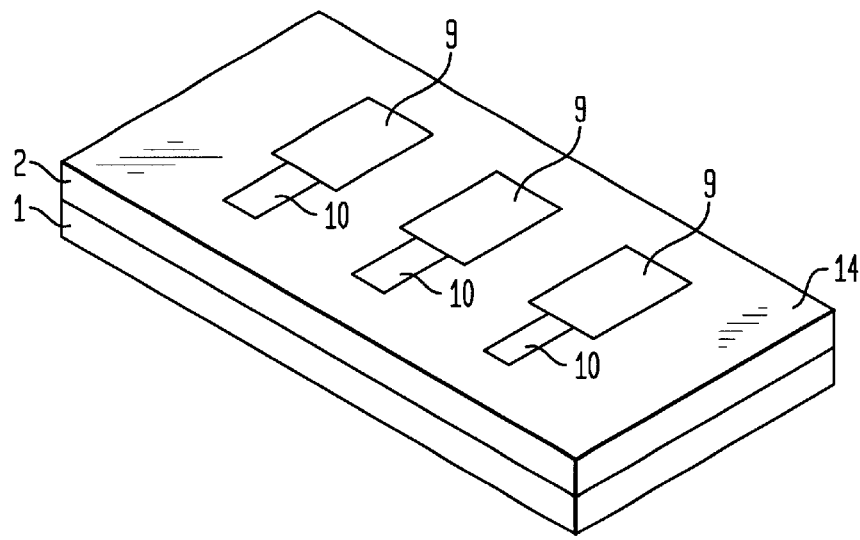

Structure 1 has a plurality of first regions 6, a plurality of second regions 7 and a third region 13, which together define a top surface 8. As is depicted in FIG. 45, a thin layer of nickel is deposited over the top surface 8 to form an adhesion promoter layer 2. Adhesion promoter layer 2 has a plurality of first sections 9 and a plurality of second sections 10, and may have a third section 14. Each of the plurality of first sections 9 overlies one of the first regions 6. Each of the plurality of second sections 10 overlies one of the second regions. If adhesion promoter layer 2 has a third section 14, it overlies the third region 13. In order to minimize the dimensions of the connection component of this aspect of the invention, the thickness of the adhesion promoter layer 2 is preferably less than 500 Å, more preferably from 75 to 250 Å. In order to minimize the time needed to undercut the lead using the stripping solution, the thickness of the adhesion promoter layer is preferably greater than or equal to 1 micron, more preferably from 1 to 5 microns. A sputtering process followed by a plating process is typically used when a thickness of greater than about 0.5 microns is desired. If the thickness of the adhesion promoter layer is at least 1 micron, then the etch rate is faster and the cleaning is better. This is because both the etching and cleaning solutions can better penetrate the area under the lead if the adhesion promoter layer is thicker and the space between the support structure and the lead is therefore larger.

Figure 46:
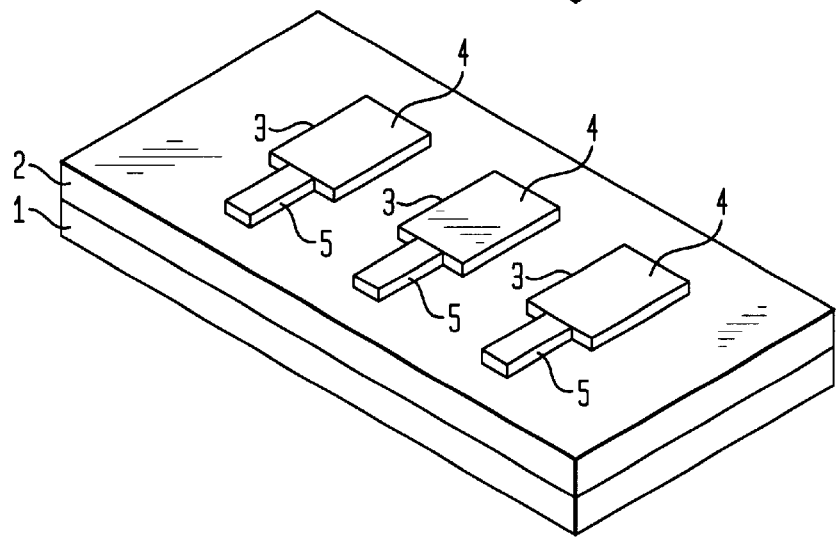

A plurality of leads 3, as are depicted in FIG. 46, are disposed over adhesion promoter layer 2. Each of the leads 3 has terminal end 4 which is associated with one of the plurality of first sections 9 and disposed over such associated first section 9; and a tip end 5 which is associated with one of said second sections 10, disposed over such associated second section 10 and offset from the terminal end 4. Each of the leads 3 is preferably comprised of copper. Each of the terminal ends 4 has a first surface area, $S_1$; and a first contact circumference $C_1$, each tip end 5 has a second surface area $S_2$ and a second contact circumference, $C_2$. Each of said leads 3 is comprised of a conductive material. The preferred conductive material is selected from the group consisting of copper, gold, gold on copper, gold on copper on gold, or alloys or combinations thereof.

Removing each of the second sections 10 after leads 3 have been formed creates the peelable nature of the leads of the connection component of this aspect of the present invention. The second sections 10 can be removed, for example, by exposure to a nickel stripping solution. Patstrip 72Y/74V/70F is a preferred nickel stripping solution which is manufactured by Patclin Chemical Co., Inc. of Yonkers, N.Y. This material is a mixture comprising ethylene diamine, sodium diethyldithiocarbamate and sodium fluoride.

A nickel stripping solution is a solution that will etch away nickel more rapidly than it will etch away other metals used in the construction of the component. In preferred embodiments, the nickel stripping solution etches nickel significantly more rapidly than the other metals and alloys used in the construction of the component.

The rate at which the nickel stripping solution etches nickel and other metals used in the construction of the component, the time of exposure to the nickel stripping solution and the relative dimensions of the terminal end 4 and tip end 5 all effect the extent to which the plurality of first sections and the plurality of second sections will be etched. These parameters must be selected such that most, and preferably all of nickel of each of the second sections, i.e., most, and preferably all, of the nickel underlying the tip end of the lead is etch away while some of the nickel of each of the first sections, i.e. the nickel underlying the terminal end of the lead, remains.

Figure 47:
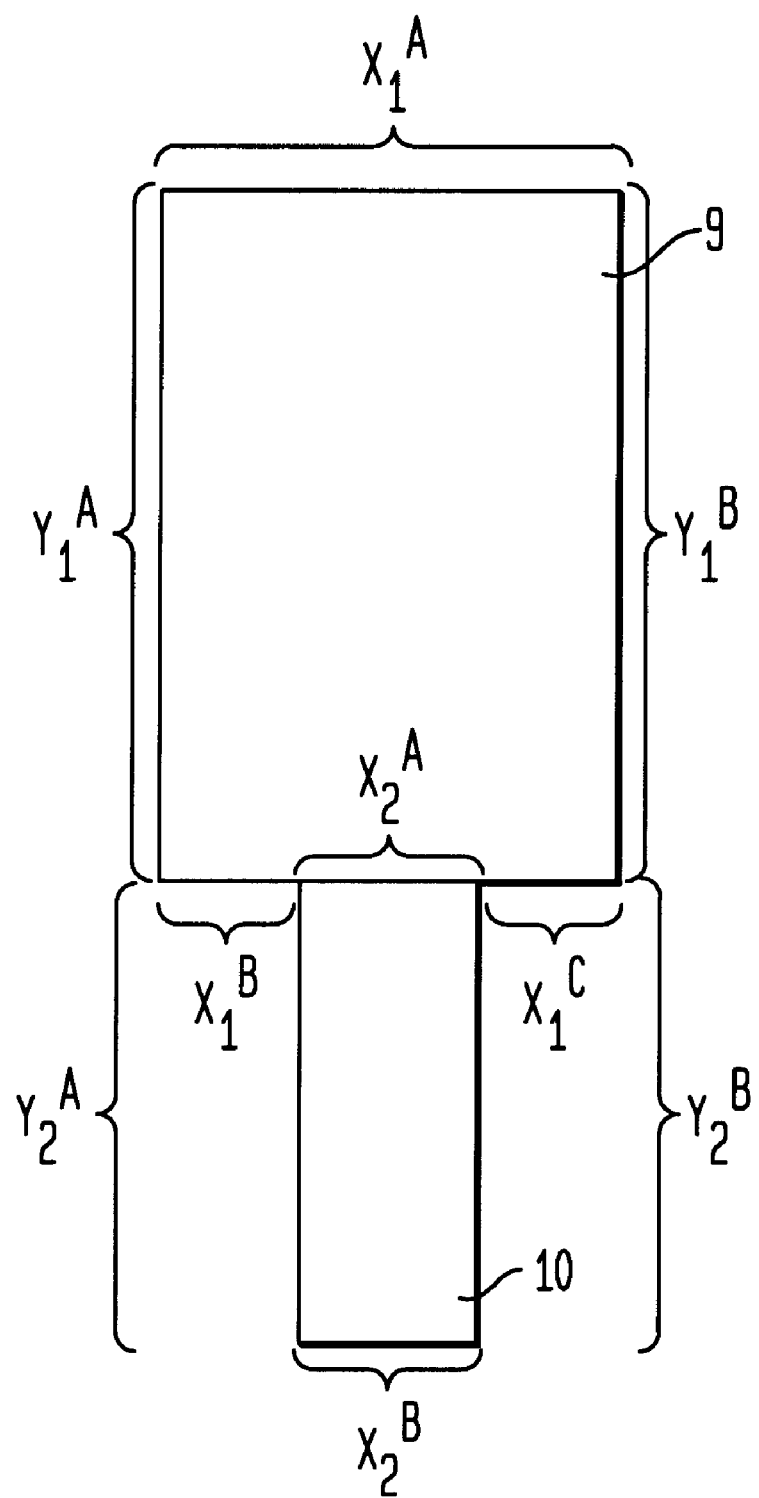
FIG. 47 is a top plan view of another embodiment of a lead of the connection component of this aspect of the invention.

If the planar surface of the first section 9, as is depicted in FIG. 47 is roughly square and the planar surface of the second section 10 is roughly rectangular, then the dimensions of the two areas should be selected such that $$S_1 - (C_1/C_2)S_2 > 0$$

wherein $S_1$ is the planar surface area and 9 is the contact circumference of the first section 9, and $S_2$ is the planar surface area and $C_2$ is the contact circumference of the second section 10. The planar surface area is the area that overlies the top surface 8. The contact circumference is that part of the circumference of the planar surface area that is exposed to the nickel striping solution. In FIG. 47, the planar surface area of the first section 9 is $(X_1^A)(Y_1^A)$, and the contact circumference is $(X_1^A) + (Y_1^A) + (X_1^B) + (X_1^C) + (Y_1^B)$. The planar surface area of the second conductive section 10 is $(X_2A)(Y_2A)$ and the contact circumference is $(Y_2^A) + (X_2^B) + (Y_2^B)$.

The planar surface of the first section 9 and the second section 10 can be other than as depicted in FIG. 47. If other planar surfaces are desired, then the relative dimensions of each section will need to be selected such that when such sections are exposed to an nickel stripping solution for a specific period of time, substantially all of the nickel of each of the first sections will be removed but some of the nickel of each of the second section will remain. This can also be achieved using a photodefined mark (i.e., a photoresist) to limit exposure of the nickel stripping solution to only the releasable portions of the leads.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, aluminum or combinations or alloys thereof. Copper, gold, and alloys and combinations thereof are particularly preferred. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated first region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The adhesion promoter layer and the leads are disposed on the first surface. The second surface preferably contains one or more layers selected from the group consisting of additional adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

13. Graphite Process

Figure 48:
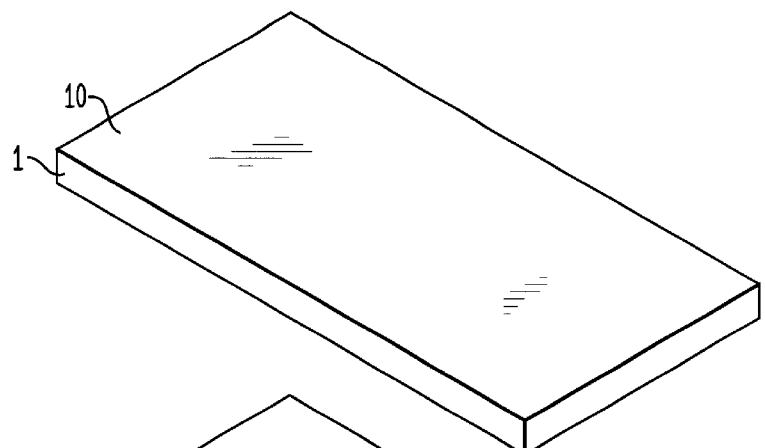
FIGS. 48–51 are diagrammatic perspective views of the connection component of another aspect of the invention in progressive stages of production.
Figure 49:
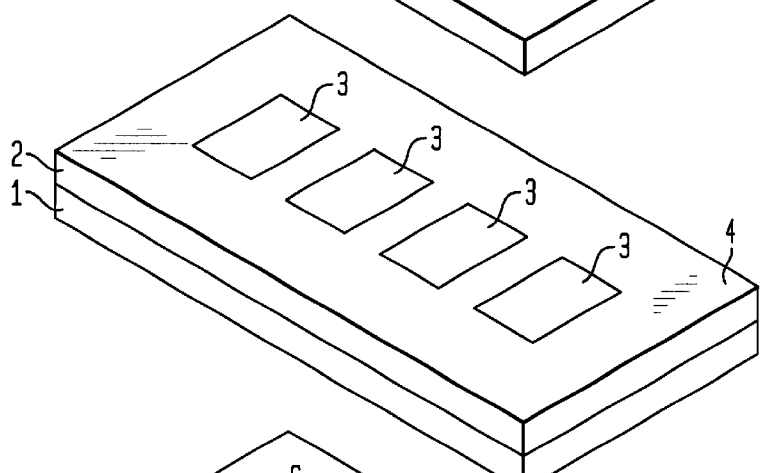

Another aspect of the present invention provides a connection component containing graphite. The process for preparing a connection component according to this aspect of the invention is depicted in FIGS. 48–51. The connection component of this aspect of the invention is prepared, as depicted in FIG. 48, by first providing a support structure having a dielectric layer 1. The support structure, may, as it is in FIG. 48, be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. Dielectric support structure ! has a top surface 10. Copper is then deposited over the top surface 10 to form a copper layer 2 having a plurality of first regions 3 and a second region 4, as is depicted in FIG. 49.

Figure 50:
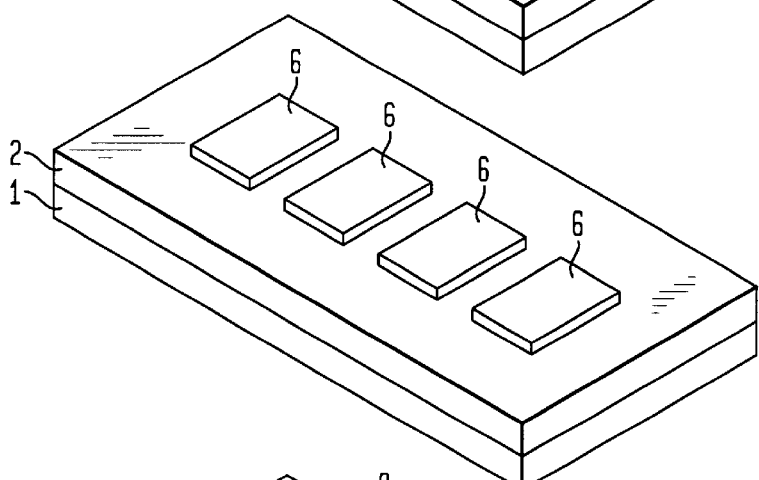
Figure 51:
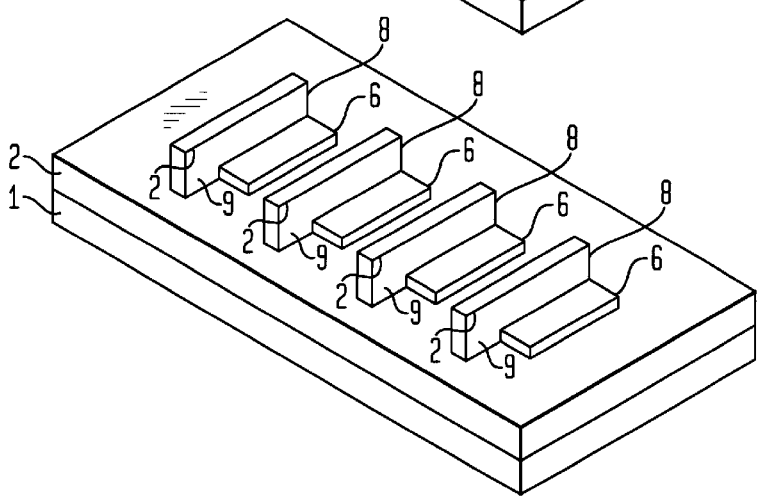

Graphite is deposited over the plurality of first regions 3 to form a plurality of graphite regions 6, as is depicted in FIG. 50. A plurality of leads 7, as is depicted in FIG. 51, are disposed over the copper layer 2. Each of the leads 7 has a terminal end 9 which is permanently attached to the second region 4; and a tip end 8 which is offset from the terminal end 9, associated with one of the plurality of graphite regions 6, and releasably connected to the associated graphite region 6.

In an alternative embodiment of this aspect of the invention, a plasma cleaning step is used after the graphite has been deposited to insure that no graphite remains under the terminal ends of the leads.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are typically made from an electrically conductive material. Preferred conductive materials include copper, gold, silver, palladium, nickel, aluminum or combinations or alloys thereof. The preferred lead has a thickness of 15–25 microns. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads may be formed by any of the know methods of forming leads which include plating, photolithography, chemical deposition, electrodeposition, sputtering, etc. The lead may also be in the form of a multi-layer construction comprising a conductive layer and a nonconductive layer. The non-conductive layer may be in the form of a polymer that is used to reinforce the lead.

In addition to a tip end and a terminal end, each lead may have an elongated section extending between the tip end and the terminal end. If the lead has an elongated section extending between the tip end and the terminal end, at least a portion of the elongated section is releasably attached to the associated graphite region, and will be peelable from the support structure. Preferably, the releasably attached portion of the elongated section is adjacent to the tip end. If the lead has an elongated section, such elongated section may be straight, as is depicted in FIG. 5, or curved. One embodiment of a connection component having a lead with a curved elongated section is depicted in FIG. 1. The elongated section may be configured with other curvatures.

In a preferred embodiment of the present aspect of the invention, the support structure has a first surface and a second surface opposite the first surface. The graphite regions and the leads are disposed on the first surface. The second surface preferably contains one or more layers selected from the group consisting of adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

14. Wire Bond Leads

Another aspect of the present invention provides a connection component having a plurality of leads, each of which is formed by bonding both ends of a thin wire to bonding pads on a dielectric support substrate.

The connection component of this aspect of the invention comprises a support substrate. The support structure, may be comprised solely of a dielectric layer, or it may be a multi-part structure. When the support layer is comprised solely of a dielectric layer, it will be referred to herein as a dielectric support structure. The support structure must include at least one dielectric layer and may include one or more layers selected from the group consisting of adhesion promoter layers, adhesion inhibiting layers, conductive layers and additional dielectric layers. The support structure has a top surface. The top surface has a plurality of first bonding pads and a plurality of second bonding pads. Each bonding first bonding pad is associated with one of the second bonding pads. Each first bonding pad is comprised of a first conductive material. Each second bonding pad is comprised of a second conductive material. The first and second conductive materials may be the same or different and are preferably selected from the group consisting of copper, gold and alloys and combinations thereof. The diameter of the first bonding pad is preferably larger than the diameter the associated second bonding pad. The connection component further includes a plurality of leads. Each of the leads has a terminal end which is permanently connected to one of the first bonding pads; and a tip end which is releasably connected to the associated second bonding pad and which is offset from the terminal end. Each lead is comprised of a strip of wire. The terminal end of each lead is bonded to one of the first bonding pads via conventional thermosonic bonding and using conventional wire bonding equipment. The tip end of the lead is bonded to the associated second bonding pad using thermosonic bonding. The bond between the terminal end and the first bonding pad must be stronger than the bond between the tip end and the associated second bonding pad. The tip/second bonding pad bond can be formed to be weaker by adjusting the pressure, vibration and/or temperature under which the bond is formed.

The dielectric layer of the component of this aspect of the invention is preferably is a thin, flexible sheet of a polymeric material such as polyimide, a fluoropolymer, a thermoplastic polymer or an elastomer, with polyimide being a particularly preferred material for use as the dielectric layer. The dielectric layer is typically from 10 to 100 microns and preferably from 25 to 75 microns in thickness.

The leads are in the form of a wire and are made from an electrically conductive material. Preferred conductive materials include copper, gold, silver, palladium, nickel, aluminum or combinations or alloys thereof, with gold being preferred. The lead may be in the form of a multi-layer construction comprising at least two conductive layers. Preferred multi-layer constructions include gold on copper and gold on nickel on copper. Gold on nickel on copper is particularly preferred because the nickel acts as an interdiffusion barrier. The leads are typically made from a wire having a round cross-section and are bonded to the bonding pads using a wire bonder. The individual wire lengths may be connected to the bonding pads using methods and apparatus similar to those employed in a wire bonding procedure commonly referred to as stitch bonding.

In a preferred embodiment of the present aspect of the invention, the support structure has a first surface and a second surface opposite the first surface. The leads are disposed on the first surface. The second surface preferably contains one or more layers selected from the group consisting of adhesion promoter layers, adhesion inhibiting layers, conductive layers and additional dielectric layers. The layers on second surface may define a ground plane and/or other circuit features, such as leads, terminals, solder pads, etc. A plurality of solder balls may be disposed on the second surface.

In preferred embodiments of each of the connection components of the various aspects of the present invention, each lead is electrically isolated from every other lead. A microelectronic element may be connected to any of the connection components of the present invention to form a microelectronic element assembly. Microelectronic elements include single semiconductor chips, a plurality of individual semiconductor chips, a plurality of interconnected semiconductor chips or a wafer. The plurality of interconnected chips may be in the form of a multichip module. The microelectronic element has a plurality of contacts. The microelectronic element assembly can be connected to a substrate, such as a printed circuit board, to prepare a microelectronic device.

As these and other variation and combinations of the features discussed above can be utilized without departing from the present invention as defined in the claims, the foregoing description of the preferred embodiments should be taken as illustrating, rather than limiting, the invention as claimed.

What is claimed is:

1. A method of making a connection component for a microelectronic element assembly, said method comprising the steps of:

A. providing a support structure having a dielectric layer, a plurality of first regions, a second region, and a top surface, wherein the top surface is defined by the plurality of first regions and the second region;

B. depositing a plurality of conductive layers, wherein each of the conductive layers is associated with one of the plurality of first regions, disposed on the associated first region, and comprised of a first conductive material; and C. forming a plurality of leads on the second region and the plurality of conductive layers, each of the leads having a terminal end connected to the second region; and a tip end associated with one of the plurality of conductive layers, connected to the associated conductive layer, offset from the terminal end, and comprised of a second conductive material;

wherein the melting point of the second conductive material is higher than the melting point of the first conductive material.

2. A method of making a microelectronic element assembly, said method comprising the steps of:

A. providing a connection component as described in claim 1;

B. providing a microelectronic element having a first surface and a plurality of contacts disposed on the first surface, wherein each of said plurality of contacts is associated with one of the plurality of tip ends; and C. bonding each tip end to the associated contact using a temperature that is high enough to melt the first conductive material but not high enough to melt the second conductive material.

3. The method of claim 2, wherein the microelectronic element is a semiconductor chip.

4. The method of claim 2, wherein the microelectronic element is a semiconductor wafer.

5. A method of making a connection component for a microelectronic element assembly, said method comprising the steps of:
- A. providing a support structure having a dielectric layer and a top surface;
- B. depositing copper over the top surface to form a copper layer, said copper layer including a plurality of first regions and a second region;
- C. depositing graphite over each one of said plurality of first regions to prepare a plurality of graphite regions; and
- D. forming a plurality of leads, each lead having a terminal end permanently attached to the second region and a tip end offset from the terminal end, associated with one of said plurality of graphite regions and releasably connected to the associated graphite region.

6. The method of claim 5, prepared by the steps further comprising the step of:
- E. plasma cleaning the second region to remove any graphite prior to forming the leads.

7. A method of making a connection component for a microelectronic element assembly, said method comprising the steps of:
- A. providing a support structure having a dielectric layer and a top surface;
- B. depositing a metal over the top surface to form a metal layer, said metal layer including a plurality of first regions and a second region;
- C. depositing graphite over each one of said plurality of first regions to prepare a plurality of graphite regions; and
- D. forming a plurality of leads, each lead having a terminal end permanently attached to the second region and a tip end offset from the terminal end, associated with one of said plurality of graphite regions and releasably connected to the associated graphite region.

8. The method of claim 7, further comprising the step of:
- A. plasma cleaning the second region to remove any graphite prior to forming the leads.

* * * * *

UNITED STATES PATENT AND TRADEMARK OFFICE
CERTIFICATE OF CORRECTION

PATENT NO.    : 6,357,112 B1
DATED         : March 19, 2002
INVENTOR(S)   : Thomas H. DiStefano et al.

It is certified that error appears in the above-identified patent and that said Letters Patent is hereby corrected as shown below:

Title page,
Item [57], ABSTRACT,
Line 4, "assemblies, has" should read -- assemblies has --.

Column 5,
Line 29, "and an tip" should read -- and a tip --.
Line 34, "preferably is a" should read -- preferably a --.
Line 64, "the know methods" should read -- the known methods --.

Column 7,
Line 7, "preferably is a" should read -- preferably a --.
Line 33, "of the know" should read -- of the known --.

Column 8,
Line 27, "preferably is a" should read -- preferably a --.
Line 56, "of the know" should read -- of the known --.

Column 9,
Line 29, "of the invention" should read -- of the invention includes --.
Line 62, "FIG. 16. Conductive" should read -- FIG. 16, conductive --.

Column 10,
Line 20, "preferably is a" should read -- preferably is --.
Line 35, "of the know" should read -- of the known --.

Column 12,
Line 53, "preferably is a" should read -- preferably a --.

Column 13,
Line 2, "of the know" should read -- of the known --.
Line 16-17, "peelable" should read -- peelable portion of the elongated section is adjacent to the tip end --.

Column 14,
Line 27, "preferably is a" should read -- preferably a --.
Line 29, "of the know" should read -- of the known --.

UNITED STATES PATENT AND TRADEMARK OFFICE
CERTIFICATE OF CORRECTION

PATENT NO.    : 6,357,112 B1
DATED         : March 19, 2002
INVENTOR(S)   : Thomas H. DiStefano et al.

It is certified that error appears in the above-identified patent and that said Letters Patent is hereby corrected as shown below:

Column 15,
Line 8, "Leave it Only" should read -- Leave it only --.
Line 54, "is position above" should read -- is positioned above --.

Column 16,
Line 22, "of the know" should read -- of the known --.

Column 17,
Line 31, "preferably is a" should read -- preferably a --.

Column 18,
Line 15, "using a underlayer" should read -- using an underlayer --.
Line 65, "preferably is a" should read -- preferably a --.

Column 19,
Line 14, "of the know" should read -- of the known --.

Column 20,
Line 32, "preferably is a" should read -- preferably a --.
Line 47, "of the know" should read -- of the known --.

Column 21,
Line 17, "is it is" should read -- is --.

Column 23,
Line 6, "preferably is a" should read -- preferably a --.
Line 23, "know methods" should read -- known methods --.

Column 24,
Line 3, "structure ! has" should read -- structure 1 has --.
Line 21, "preferably is  a" should read -- preferably a --.
Line 36, "of the know" should read -- of the known --.

UNITED STATES PATENT AND TRADEMARK OFFICE
CERTIFICATE OF CORRECTION

PATENT NO.    : 6,357,112 B1
DATED         : March 19, 2002
INVENTOR(S)   : Thomas H. DiStefano et al.

It is certified that error appears in the above-identified patent and that said Letters Patent is hereby corrected as shown below:

Column 25,
Line 43, "preferably is a" should read -- preferably a --.

Signed and Sealed this

Twenty-first Day of January, 2003

JAMES E. ROGAN
*Director of the United States Patent and Trademark Office*